United States Patent
Sravan et al.

(10) Patent No.: US 11,620,050 B2
(45) Date of Patent: Apr. 4, 2023

(54) SOFT DATA COMPRESSION FOR NON-VOLATILE MEMORY

(71) Applicant: SANDISK TECHNOLOGIES LLC, Addison, TX (US)

(72) Inventors: A Harihara Sravan, Karnataka (IN); Yan Li, Milpitas, CA (US); Feng Lu, Fremont, CA (US)

(73) Assignee: Sandisk Technologies LLC, Addison, TX (US)

( * ) Notice: Subject to any disclaimer, the term of this patent is extended or adjusted under 35 U.S.C. 154(b) by 0 days.

(21) Appl. No.: 17/359,945

(22) Filed: Jun. 28, 2021

(65) Prior Publication Data

US 2022/0129163 A1 Apr. 28, 2022

(30) Foreign Application Priority Data

Sep. 25, 2020 (IN) .............................. 202041041579

(51) Int. Cl.
*G06F 3/06* (2006.01)

(52) U.S. Cl.
CPC .......... *G06F 3/0608* (2013.01); *G06F 3/0655* (2013.01); *G06F 3/0679* (2013.01)

(58) Field of Classification Search
CPC ...... G06F 3/0656; G06F 3/061; G06F 3/0679; G06F 3/0655; G06F 3/0638; G06F 3/0608; G06F 12/08; G11C 11/5642; G11C 16/0483; G11C 7/1006; G11C 11/5628; G11C 29/52; G11C 2211/5621; G11C 2211/5641; G11C 2207/102; G11C 2029/0411; G11C 29/40; H03M 7/30
USPC .................................................. 711/154, 103
See application file for complete search history.

(56) References Cited

U.S. PATENT DOCUMENTS

| | | | |
|---|---|---|---|
| 9,978,462 B2* | 5/2018 | Ravimohan | G11C 11/5642 |
| 2014/0157087 A1* | 6/2014 | Yurzola | G11C 29/52 |
| | | | 714/773 |
| 2021/0049067 A1* | 2/2021 | Choi | G06F 11/1076 |

* cited by examiner

*Primary Examiner* — Hashem Farrokh
(74) *Attorney, Agent, or Firm* — Morgan, Lewis & Bockius LLP

(57) ABSTRACT

An encoder of a storage medium receives, at a plurality of latches respectively associated with a plurality of memory cells, soft data corresponding to data subject to a read operation specified by the a storage controller, compresses the soft data, and stores the compressed soft data in a buffer before transmitting the compressed soft data to the storage controller. Upon the buffer being full, the encoder writes uncompressed soft data back to at least a subset of the plurality of latches, and upon completion of the writing of the uncompressed soft data, the encoder resumes compressing and storing of soft data in the buffer, and transmits the compressed soft data to the storage controller.

20 Claims, 13 Drawing Sheets

1300 ⬎

| | Compression Scheme | Area (w/o FIFO) | Compression Ratio | Correctable BER | FIFO Depth | Latency |
|---|---|---|---|---|---|---|
| 1 | 160 → 32 | ~7000 um | 20% | >0.9 | 20 byte | 12.2us |
| 2 | 144 → 24 (72+72) | ~3200 um | 16.67% | >0.9 | 18 byte | 12.7us |
| 3 | 128 → 24 (64+64) | ~3400 um | 18.75% | >0.9 | 18 byte | 12.7us |

Figure 13

SOFT DATA COMPRESSION FOR NON-VOLATILE MEMORY

TECHNICAL FIELD

The present disclosure relates to data storage systems, and in particular, to a data compression technique involving soft data being read from a storage medium of a data storage system.

BACKGROUND

Non-volatile memories, such as flash memory devices, have supported the increased portability of consumer electronics, and have been utilized in relatively low power enterprise storage systems suitable for cloud computing and mass storage. The ever-present demand for almost continual advancement in these areas is often accompanied by demand to improve data storage capacity. The demand for greater storage capacity in turn stokes demand for greater performance (e.g., quicker reads and writes), so that the addition of storage capacity does not slow down the memory device. As such, there is ongoing pressure to increase the capacity and the operating speed of non-volatile memories in order to further improve the useful attributes of such devices.

SUMMARY

This application describes various systems and methods of compression of soft data at an interface between a storage controller and a storage medium.

In one aspect, a data storage system comprises a storage medium including a plurality of memory cells and an encoder; a storage controller in communication with the storage medium; and electrical interface circuitry configured to transfer data via a channel disposed between the storage medium and the storage controller.

The encoder of the storage medium is configured to: receive, at a plurality of latches respectively associated with a plurality of memory cells, soft data corresponding to data subject to a read operation specified by the storage controller; compress the soft data; store the compressed soft data in a buffer before transmitting the compressed soft data to the storage controller; upon the buffer being full, write uncompressed soft data back to at least a subset of the plurality of latches; and upon completion of the writing of the uncompressed soft data, resume compressing and storing of soft data in the buffer, and transmit the compressed soft data to the storage controller.

In some implementations, the subset of the plurality of latches includes at least one latch from which the soft data was received.

In some implementations, the encoder is further configure to: associate a plurality of address pointers to the plurality of latches; and write the uncompressed soft data back to the subset of the plurality of latches in accordance with the plurality of address pointers.

In some implementations, the encoder is further configured to disable error correction while writing the uncompressed soft data back to the subset of the plurality of latches.

In some implementations, the soft data includes a plurality of bytes; and the encoder is configured to compress the soft data by: indicating a position of a first logic 1 within a first subset of the plurality of bytes; and indicating a position of a second logic 1 within a second subset of the plurality of bytes; wherein the first and second subsets of the plurality of bytes overlap, the first subset of the plurality of bytes includes a byte not included in the second subset of the plurality of bytes, and the second subset of the plurality of bytes includes a byte not included in the first subset of the plurality of bytes.

In some implementations, the electrical interface circuitry includes a data path having a first width; and the encoder includes two compressors, each compressor configured to compress data in groups of bits associated with a second width different from the first width.

In some implementations, the encoder further includes a plurality of flip flops; a first of the two compressors is configured to alternately (i) compress soft data received during a current cycle and soft data received during a previous cycle stored in the plurality of flip flops, and (ii) compress only soft data received during a current cycle; and a second of the two compressors is configured to alternately (i) compress soft data received during a current cycle, and (ii) forgo compression of soft data received during a current cycle.

Various implementations of systems and methods within the scope of the appended claims each have several aspects, no single one of which is solely responsible for the desirable attributes described herein. Without limiting the scope of the appended claims, some prominent features are described. After considering this discussion, and particularly after reading the section entitled "Detailed Description" one will understand how the features of various implementations are used to improve performance at the interface in a tunable and scalable manner.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

FIG. 13 is a table 1300 showing three compression schemes and their corresponding latencies, as well as areas, compression ratios, buffer depths, and correctable bit-error rates (BER) in accordance with some implementations.

Figure 1:
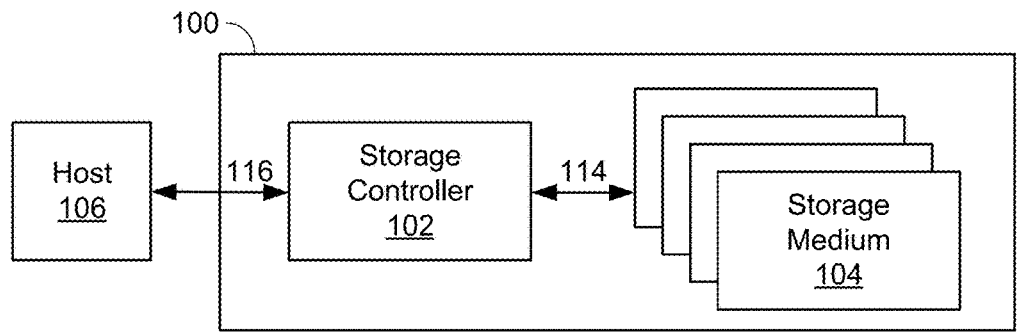
FIG. 1 is a functional block diagram of a non-volatile storage system in accordance with some implementations.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals are used to denote like features throughout the specification and figures.

DETAILED DESCRIPTION

FIG. 1 is a functional block diagram of a non-volatile storage system in accordance with some implementations. Storage system 100 includes a storage controller 102 (sometimes referred to as a flash memory controller) and non-volatile memory that may be made up of one or more storage mediums 104 (sometimes referred to as memory dies). As used herein, the term storage medium (or memory die) refers to a plurality of non-volatile memory cells (e.g., one or more memory arrays), and associated circuitry (e.g., peripheral circuitry) for managing the physical operation of the non-volatile memory cells. In some implementations, the memory cells and associated circuitry are formed on a single semiconductor substrate. Storage controller 102 interfaces with a host system 106 (also referred to as a host) and transmits command sequences for read, program, and erase operations to storage medium(s) 104. Throughout this disclosure, reference may be made to a single storage medium 104. However, it should be understood that such features may additionally or alternatively be implemented across a plurality of storage mediums 104.

The storage controller 102 manages data stored on one or more storage mediums 104 (e.g., flash memory) and communicates with a host 106, such as a computer or electronic device. The storage controller 102 can have various functionality in addition to the specific functionality described herein. For example, the storage controller 102 can format the storage medium 104 to ensure the memory is operating properly, map out bad memory cells, and allocate spare memory cells to be substituted for future failed memory cells. Some part of the spare memory cells can be used to hold firmware to operate the storage controller 102 and implement other features.

In operation, when the host 106 needs to read data from or write data to a storage medium 104, the host 106 communicates with the storage controller 102. If the host 106 provides a logical address to which data is to be read/written, the storage controller 102 may convert the logical address received from the host 106 to a physical address in the storage medium 104. Alternatively, the host 106 may provide the physical address. The storage controller 102 may also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The storage medium(s) 104 may include any suitable non-volatile storage medium, including NAND flash memory cells and/or NOR flash memory cells. The memory cells can take the form of solid-state (e.g., flash) memory cells and can be one-time programmable, few-time programmable, or multi-time programmable. The memory cells can also be single-level cells (SLC), multiple-level cells (MLC), triple-level cells (TLC), quad-level cells (QLC), or use other memory cell level technologies. Also, the memory cells can be fabricated in a two-dimensional or three-dimensional fashion.

The interface between the storage controller 102 and the storage medium(s) 104 may be any suitable flash interface, such as Toggle Mode or Open NAND Flash Interface (ONFI).

In some implementations, storage system 100 may be a card-based system, such as a secure digital (SD) or a micro secure digital (micro-SD) card. In some implementations, storage system 100 may be part of an embedded storage system. For example, the storage controller 102 and storage medium(s) 104 may be embedded within the host 106, such as in the form of a solid-state disk (SSD) drive installed in a computer. Such an SSD may emulate, replace, or be used instead of a hard disk drive inside the host 106, or be used as a NAS device, and so forth. In any case, such an SSD need not be made to work as a hard drive.

Although in the example illustrated in FIG. 1, storage system 100 includes a single channel between storage controller 102 and storage medium 104, the subject matter described herein is not limited to having a single memory channel. For example, in some storage system architectures, two, four, eight, or more channels may exist between the storage controller 102 and the storage medium(s) 104, depending on controller capabilities. In any of the implementations described herein, a plurality of channels may exist between the storage controller 102 and the storage medium(s) 104, even if a single channel is depicted in the drawings.

In some implementations, an intermediate storage controller (not shown) may interface the host 106 with the storage controllers 102 of a plurality of storage systems 100. The interface between the intermediate storage controller and the plurality of storage systems 100 may be a bus interface, such as a serial advanced technology attachment (SATA) or peripheral component interface express (PCIe) interface. The plurality of storage systems 100 may be implemented in a solid state drive (SSD), such as found in portable computing devices, such as laptop computers, tablet computers, or mobile devices.

In some implementations, a plurality of intermediate storage controllers (not shown) may respectively interface the host 106 with the storage controllers 102 of a plurality of storage systems 100. Such a system may be referred to as a hierarchical storage system. The host 106 may access memories within the storage systems 100 via a bus interface. In some implementations, the bus interface may be an NVMe or fiber channel over Ethernet (FCoE) interface. In some implementations, a hierarchical storage system may be a rack mountable mass storage system that is accessible by multiple host 106 computers, such as would be found in a data center or other location where mass storage is needed.

Figure 2:
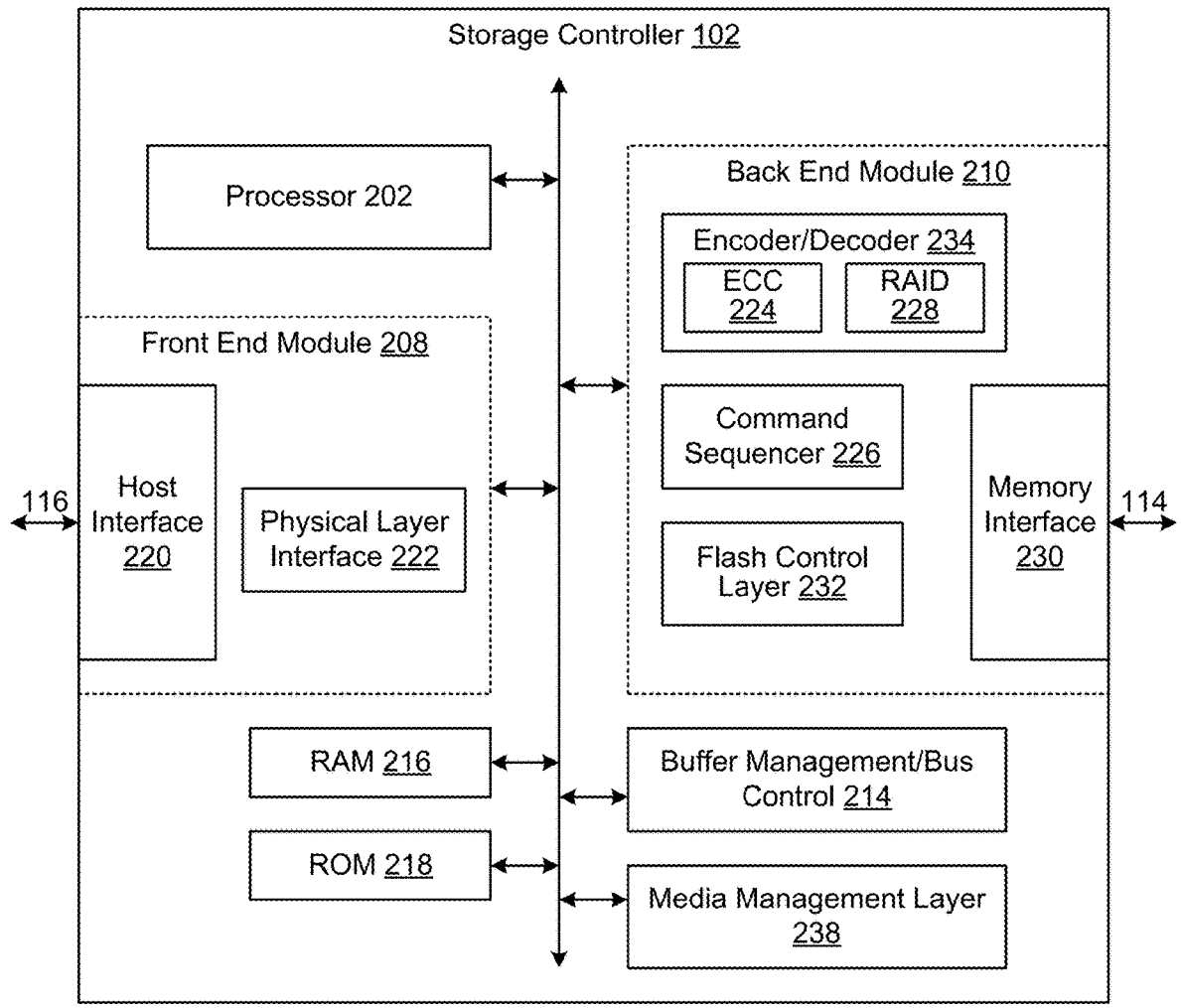
FIG. 2 is a functional block diagram of an example storage controller 102 of the storage system 100 in accordance with some implementations.

FIG. 2 is a functional block diagram of an example storage controller 102 of the storage system 100 in accordance with some implementations. Storage controller 102 includes a front-end module 208 that interfaces with a host 106, a back-end module 210 that interfaces with one or more non-volatile storage mediums 104, and various other modules that perform functions described herein.

The storage controller 102 can take the form of processing circuitry, a microprocessor or processor, and a non-transitory computer-readable medium that stores computer-readable program code (e.g., firmware) executable by the (micro) processor, logic gates, switches, an application specific integrated circuit (ASIC), a programmable logic controller, and/or an embedded microcontroller, for example. Storage controller 102 can be configured with hardware and/or firmware to perform the various functions described herein. Also, some of the components shown as being internal to the storage controller 102 (e.g., RAM 216 and ROM 218) can also be stored external to the storage controller 102, and other components can be used. Additionally, the phrase "operatively in communication with" could mean directly in communication with or indirectly (wired or wireless) in communication with through one or more components, which may or may not be shown or described herein.

The components of storage controller 102 depicted in FIG. 2 may take the form of a packaged functional hardware unit (e.g., an electrical circuit) designed for use with other components, a portion of a program code (e.g., software or firmware) executable by a (micro)processor or processing circuitry (or one or more processors) that usually performs a particular function or related functions, or a self-contained hardware or software component that interfaces with a larger system. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively, or in addition, each module may include or comprise software stored in a processor readable device (e.g., memory) to program one or more processors for storage controller 102 to perform the functions described herein.

The storage controller 102 may include a buffer manager/bus controller 214, configured to manage buffers in random access memory (RAM) 216 and control the internal bus arbitration of the storage controller 102. A read only memory (ROM) 218 may store system boot code. Although illustrated in FIG. 2 as located within the storage controller 102, in some implementations one or both of the RAM 216 and ROM 218 may be located separately from the storage controller 102. In yet other implementations, portions of RAM 216 and ROM 218 may be located both within the storage controller 102 and outside the storage controller 102. Further, in some implementations, the storage controller 102, RAM 216, and ROM 218 may be located on separate semiconductor dies.

The storage controller 102 may include one or more processors 202 configured to control the overall operation of the storage controller 102. The processor 202 may issue commands to control circuitry 310 (FIG. 3) of storage medium 104, or to any other component of storage medium 104, via memory interface 230. In some implementations, the ROM 218 and/or RAM 216 may comprise code such as a set of instructions, and the processor 202 may be operable to execute the set of instructions to provide the functionality described herein. Additionally or alternatively, the processor 202 may access code from a portion of the memory array 350 (FIG. 3) in the storage medium 104, such as a reserved area of memory cells connected to one or more word lines.

The front-end module 208 includes a host interface 220 that provides a communication interface with the host 106. The choice of the type of host interface 220 can depend on the type of memory being used. Examples of host interfaces include, but are not limited to, SATA, SATA Express, SAS, Fibre Channel, USB, PCIe, and NVMe. The host interface 220 is a communication interface that facilitates transfer for data, control signals, and timing signals. The host interface 220 may include electrical interface circuitry that provides a physical connection to the channel(s) 116 connecting the storage controller 102 to the host. This electrical interface circuitry may be part of the host interface 220, or may be separately described as a physical layer interface 222.

In some implementations, the host interface 220, in communication with ROM 218, RAM 216, and/or processor 202, may be an electrical circuit that provides an electrical interface between the storage controller 102 and the host 106. For example, the host interface 220 may change the format or timing of signals, provide a buffer, isolate from surges, latch I/O, and so forth. Commands and data from the host 106 are received by the storage controller 102 via the host interface 220. Data sent to the host 106 is transmitted via the host interface 220.

The back-end module 210 includes a memory interface 230 that provides command sequences and data (to be written) to storage medium(s) 104 and receives status information and data (that was read) from storage medium(s) 104. In some implementations, the memory interface 230 may be a double data rate (DDR) interface such as Toggle Mode or ONFI.

In some implementations, the memory interface 230, in communication with ROM 218, RAM 216, and/or processor 202, may be an electrical circuit that provides an electrical interface between the storage controller 102 and the storage medium 104. For example, the memory interface 230 may change the format or timing of signals, provide a buffer, isolate from surges, latch I/O, and so forth.

The back-end module 210 may include an error correction controller (ECC) engine 224 and/or a Redundant Array of Independent Dies (RAID) module 228. The ECC engine 224 may be configured to encode data received from the host 106, and decode and error correct data read from the storage medium 104. The RAID module 228 may be configured to manage generation of RAID parity and recovery of failed data. The RAID parity may be used as an additional level of integrity protection for the data being written into the storage medium 104.

In some implementations, the RAID module 228 may be a part of the ECC engine 224. The RAID parity may be added as an extra die or dies as implied by the common name, but it may also be added within the existing die, e.g., as an extra plane, or extra block, or extra WLs within a block. ECC engine 224 and RAID module 228 may both calculate redundant data that can be used to recover when errors occur and may be considered examples of redundancy encoders. Together, ECC engine 224 and RAID module 228 may be considered to form a combined redundancy encoder/decoder 234.

The back-end module 210 may include a command sequencer 226, and/or a flash control layer 232. The command sequencer 226 may generate command sequences, such as program and erase command sequences, for transmission to storage medium 104. The flash control layer 232 may control the overall operation of the back-end module 210.

The storage controller 102 may include a media management layer 238, which performs wear leveling of memory cells of storage medium 104. The storage controller 102 may also include other discrete components (not shown), such as external electrical interfaces, external RAM, resistors, capacitors, or other components that may interface with storage controller 102. In some implementations, one or more of the physical layer interface 222, RAID module 228, media management layer 238 and buffer management/bus controller 214 are optional components that are not necessary in the storage controller 102.

The Flash Translation Layer (FTL) or Media Management Layer (MML) 238 may be integrated as part of the flash management that may handle flash errors and interfacing with the host 106. In particular, the MML 238 may be a module in flash management and may be responsible for the internals of NAND management. In particular, the MML 238 may include an algorithm in the storage device firmware which translates writes from the host 106 into writes to the storage medium 104.

The MML 238 may be needed because: 1) storage medium 104 may have limited endurance; 2) storage medium 104 may only be written in multiples of pages; and/or 3) a selected portion of memory cells of the storage medium 104 may not be written unless it is erased as a block (i.e. a block may be considered to be a minimum unit of erase and such a non-volatile memory may be considered a block-erasable non-volatile memory). The MML 238 may address these potential limitations of the storage medium 104 which may not be visible to the host 106. Accordingly, the MML 238 may translate write operations received from the host 106 into write operations for transmission to the storage medium 104.

Figure 3:
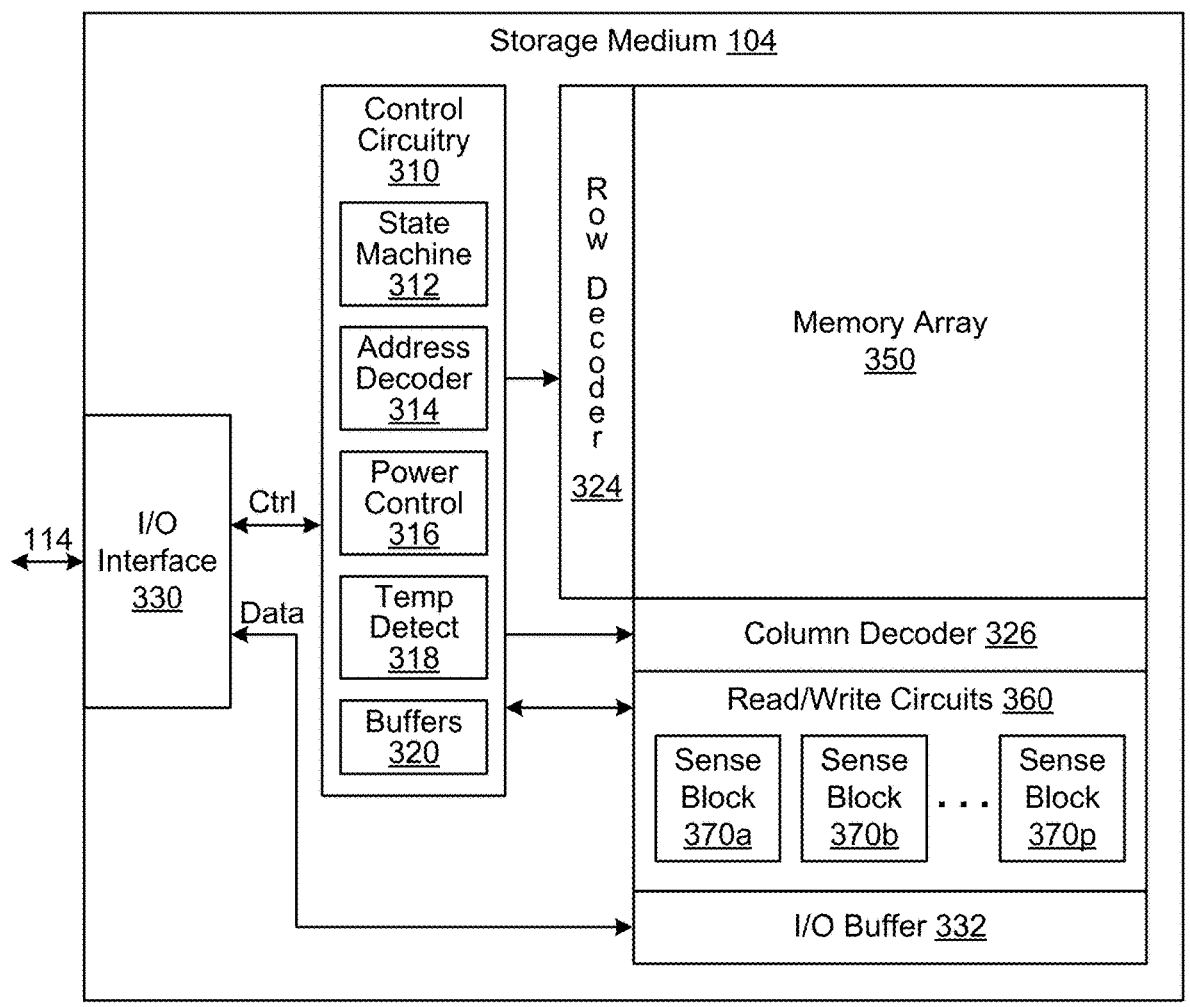
FIG. 3 is a functional block diagram of an example storage medium 104 of the storage system 100 in accordance with some implementations.

FIG. 3 is a functional block diagram of an example storage medium 104 of the storage system 100 in accordance with some implementations. Storage medium 104 includes a memory array 350 including a plurality of memory cells, control circuitry 310, read/write circuits 360, and an input/output (I/O) interface 330.

In some implementations, a storage controller 102 (as described above with reference to FIG. 2) may included in the same storage device (e.g., a removable storage card) as the storage medium(s) 104. However, in other implementations, the storage controller 102 may be separated from the storage medium(s) 104. In some implementations, the storage controller 102 may be disposed on a different die than the storage medium 104. In some implementations, one storage controller 102 may communicate with a plurality of storage mediums 104. In some implementations, each storage medium 104 may have its own storage controller 102.

Commands and data may be transferred between the host 106 and the storage controller 102 via a data bus 116, and between the storage controller 102 and storage medium(s) 104 via an interface channel 114. In some implementations, the I/O interface 330 includes a set of I/O pins (also referred to as pads) that connect to respective communication lines of the interface channel 114. The I/O interface 330 may be connected to the control circuitry 310, row decoder 324, column decoder 326, read/write circuits 360, and/or memory array 350.

The I/O interface 330 may be a synchronous interface or an asynchronous interface. Examples of an I/O interface include a Toggle Mode Interface and an Open NAND Flash Interface (ONFI). Other I/O interfaces can also be used. Toggle mode (e.g., Toggle Mode 2.0 JEDEC Standard or Toggle Mode 900) is an asynchronous memory interface that supports SDR and DDR with a DQS signal acting as a data strobe signal.

Data received at the I/O interface 330 for writing to the memory array 350 (in accordance with a write command) is latched in an I/O buffer 332 before being written to the memory array 350. Similarly, data that is read from the memory array 350 (in accordance with a read command) is latched in the I/O buffer 332 before being transmitted to the storage controller 102 via the I/O interface 330. The I/O buffer 332 may be included in the I/O interface 330 or otherwise communicatively coupled to the I/O interface 330. The I/O buffer 332 includes a plurality of data latches. In some implementations, the data latches are arranged in groups of 8 (XDL0 through XDL7) or 16 (XDL0 through XDL15), depending on how many bits the I/O interface 330 is configured to receive or transmit at a time.

The read/write circuits 360 include multiple sense blocks 370 including 370a through 370p (sensing circuitry) and allow a page (or multiple pages) of data in multiple memory cells of the memory array 350 to be read or programmed (written) in parallel. In some implementations, each sense block 370 includes one or more sense amplifiers connected to respective bit lines of the memory array 350. The sense amplifiers sense voltage signals associated with selected memory cells (e.g., determining whether a given memory cell is conducting current during a sense operation, or how much current the given memory cell conducts during the sense operation). The sense amplifiers then amplify the sensed voltages to levels that are optimized for the I/O circuitry of the storage medium 104, interface channel 114, and storage controller 102.

Each bit line of the memory array 350 is coupled to a sense block 370, each of which includes one or more sense amplifiers. The sense amplifiers sense voltages on each bit line in accordance with read operations. The sense amplifiers sense the low power signals from respective bit lines that represents data bits (1 or 0) stored in respective memory cells. The sense amplifiers amplify small voltage swings to recognizable logic levels so the data can be interpreted properly by logic outside the memory array (e.g., storage controller 102). After a sense amplifier for a particular bit line amplifies the sensed voltage to a normal logic level, the bit from the desired cell is then latched from the cell's sense amplifier into a data latch in the I/O buffer 332, and transferred to the storage controller 102 on data lines DQ of the output bus 114.

The sense amplifiers sense data read onto corresponding bit lines from a plurality of memory cells associated with the corresponding bit lines. The sense amplifiers may include bit line drivers for applying a voltage to corresponding bit lines in accordance with write data. The sense amplifier for a given bit line or group of bit lines may directly control the bit line(s). In data reading, the read/write circuits 360 may apply a strobe signal to a given sense amplifier. The sense amplifier determines data at the assertion timing of the strobe signal (e.g., an ON state of a memory cell may be defined as data "0", and an off state may be defined as data "1"). This data may be held in an internal latch SADL of the sense amplifier before being transferred to one of the data latches of the I/O buffer 332.

Input and output of data to and from the sense amplifiers are performed via the data latches of the I/O buffer 332. That is, data received from the storage controller 102 is transferred to sense amplifiers via the data latches. In addition, data in the sense amplifiers (in internal latches of the sense amplifiers) is transmitted to the storage controller 102 via the data latches. The data latches of the I/O buffer 332 may function as the cache memory of the storage medium 104.

The control circuitry 310 cooperates with the read/write circuits 360 to perform memory operations (e.g., write, read, erase, and others) on the memory array 350. In some implementations, control circuitry 310 includes a state machine 312, an on-chip address decoder 314, a power control circuit 316, a temperature detection circuit 318, and/or buffers 320.

The state machine 312 provides die-level control of memory operations. In some implementations, the state machine 312 is programmable by software. In other implementations, the state machine 312 does not use software and is completely implemented in hardware (e.g., electrical circuits). In some implementations, the state machine 312 can be replaced by a microcontroller or microprocessor.

The address decoder 314 provides an address interface between addresses used by the host 106 or storage controller 102 to the hardware address used by the decoders 324 and 326.

The power control module 316 controls the power and voltages supplied to the word lines and bit lines during memory operations. It can include drivers for word line layers (discussed below) in a 3D configuration, select transistors (e.g., SGS and SGD transistors, described below) and source lines. Power control module 316 may include charge pumps for creating voltages.

The temperature detection circuit 318 may be configured to detect temperature in or around the storage medium 104. The temperature detection circuit 318 may include an on-chip temperature sensor.

The buffers 320 may be registers, ROM fuses, and/or other storage devices for storing default values such as base voltages and other parameters.

Any one or any combination of control circuitry 310, state machine 312, decoders 314/324/326, temperature detection circuit 318, power control module 316, sense blocks 370, read/write circuits 360, and storage controller 102 can be considered one or more control circuits (or managing circuitry, or peripheral circuitry) that performs the functions described herein.

The memory array 350 may be addressable by word lines via a row decoder 324 and by bit lines via a column decoder 326. The memory array 350 may comprise one or more 2D or 3D arrays of memory cells. The memory array 350 may comprise a monolithic 3D memory array in which multiple memory levels are formed above (and not in) a single substrate, such as a wafer, with no intervening substrates. The memory array 350 may comprise any type of non-volatile memory that is monolithically formed in one or more physical levels of arrays of memory cells having an active area disposed above a silicon substrate. The memory array 350 may be in a non-volatile memory device having circuitry associated with the operation of the memory cells, whether the associated circuitry is above or within the substrate.

Multiple memory elements in memory array 350 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors. In some implementations, the non-volatile memory cells of memory array 350 comprise vertical NAND strings with charge-trapping material. In such a configuration, a NAND string includes memory cells connected by a channel.

A NAND flash memory array 350 may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three-dimensional memory array 350 may be arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three-dimensional memory array 350 may be vertically arranged as a stack of multiple two-dimensional memory device levels. As another non-limiting example, a three-dimensional memory array 350 may be arranged as multiple vertical columns (e.g., columns extending substantially perpendicular to the major surface of the substrate, i.e., in the y direction) with each column having multiple memory cells. The vertical columns may be arranged in a two-dimensional configuration, e.g., in an x-y plane, resulting in a three-dimensional arrangement of memory cells, with memory cells on multiple vertically stacked memory planes. Other configurations of memory elements in three dimensions can also constitute a three-dimensional memory array.

By way of a non-limiting example, in a three-dimensional NAND memory array, the memory elements may be coupled together to form vertical NAND strings that traverse across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

In some implementations, the memory array 350 comprises a two dimensional memory array of non-volatile memory cells. In one example, the non-volatile memory cells are NAND flash memory cells utilize floating gates. Other types of memory cells (e.g., NOR-type flash memory) can also be used.

The exact type of memory array architecture or memory cells included in the memory array 350 is not limited to the examples above. Many different types of memory array architectures or memory cell technologies can be used to form the memory array 350. No particular non-volatile memory technology is required for purposes of the implementations described herein. Other examples of suitable technologies for memory cells of the memory array 350 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of the memory array 350 include two dimensional arrays, three dimensional arrays, cross-point arrays, stacked two dimensional arrays, vertical bit line arrays, and the like.

A person of ordinary skill in the art will recognize that the technology described herein is not limited to a single specific memory array, but covers many relevant memory arrays within the spirit and scope of the technology as described herein and as understood by one of ordinary skill in the art.

Figure 4:
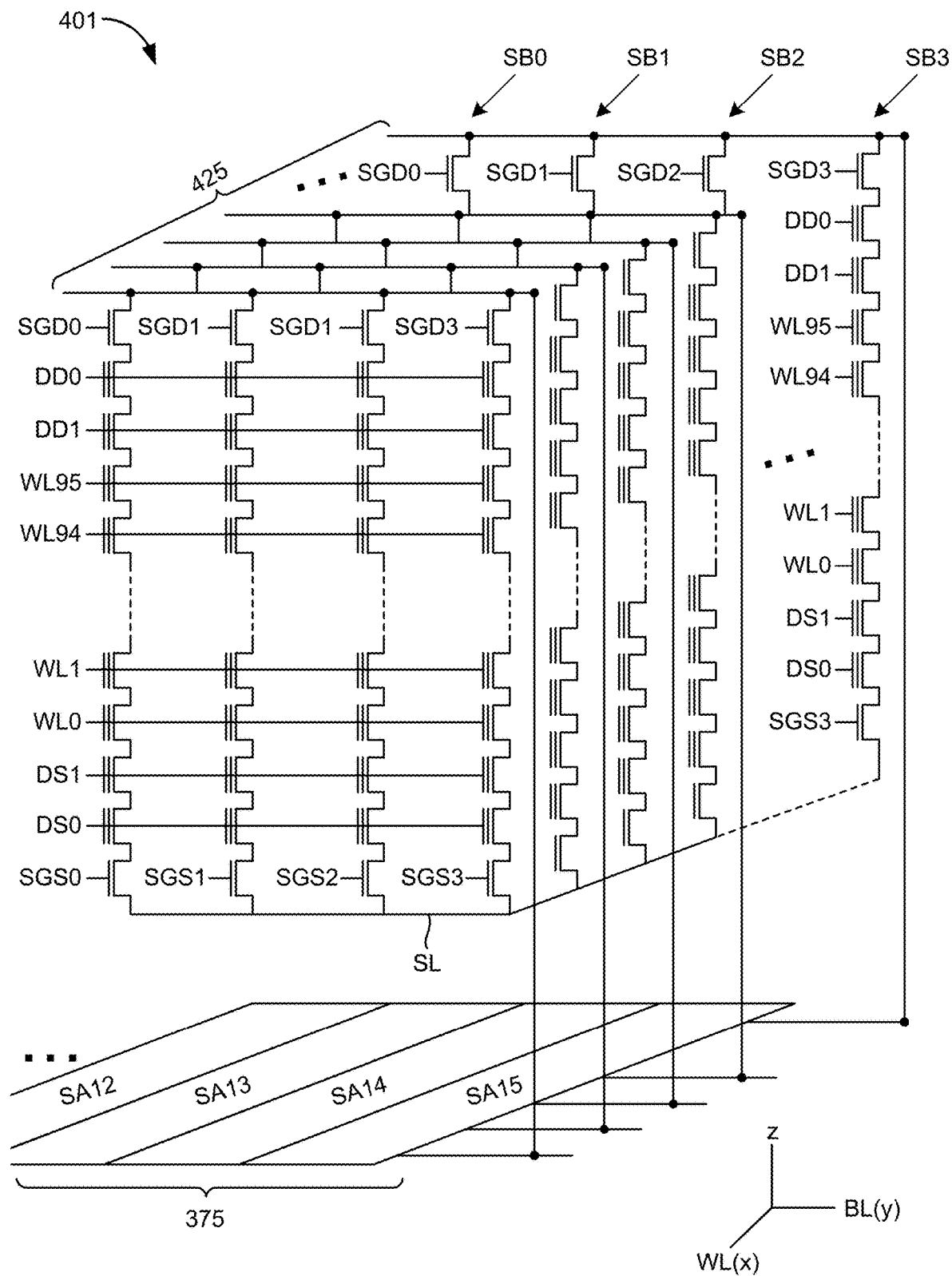
FIG. 4 is a schematic diagram of a portion of the memory array 350 depicted in FIG. 3 in accordance with some implementations.

FIG. 4 is a schematic diagram of a portion of the memory array 350 depicted in FIG. 3 in accordance with some implementations. FIG. 4 shows physical word lines WL0-WL95 running across the entire block. Within the block, each bit line 425 is connected to four NAND strings. Drain side selection lines SGD0, SGD1, SGD2 and SGD3 are used to determine which of the four NAND strings connect to the associated bit line(s). Source side selection lines SGS0, SGS1, SGS2 and SGS3 are used to determine which of the four NAND strings connect to the common source line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Each bit line 425 is connected to sense amplifiers in the peripheral circuitry of the storage medium 104 (e.g., in sense blocks 370 of the read/write circuits 360). The sense amplifiers sense voltage signals associated with selected memory cells of the respective NAND strings corresponding to each bit line (e.g., determining whether a given memory cell is conducting current during a sense operation, or how much current the given memory cell conducts during the sense operation). The sense amplifiers then amplify the sensed voltages to levels that are optimized for the I/O circuitry of the storage medium 104, interface channel 114, and storage controller 102.

Memory cells in the various implementations of the memory array 350 described above can be erased, programmed, and read. At the end of a successful programming process (with verification), the threshold voltages of the memory cells should be within one or more distributions (ranges) of threshold voltages for programmed memory cells or within a distribution (range) of threshold voltages for erased memory cells, as appropriate.

Figure 5:
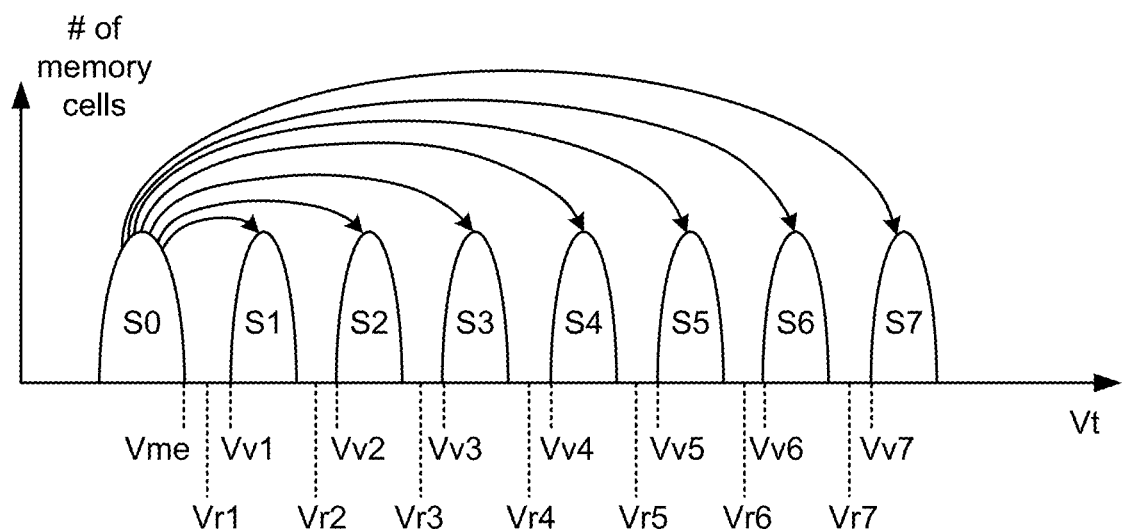
FIG. 5 illustrates example threshold voltage distributions (ranges) for TLC memory cells that store three bits of data in accordance with some implementations.

FIG. 5 illustrates example threshold voltage distributions (ranges) for TLC memory cells that store three bits of data in accordance with some implementations. Other implementations, however, may use other data capacities per memory cell (e.g., such as one, two, four, five, or more bits of data per memory cell). FIG. 5 shows eight threshold voltage distributions, corresponding to eight data states. The first threshold voltage distribution (data state) S0 represents memory cells that are erased. The system uses an erase verify reference voltage Vme to test whether the memory cells are sufficiently erased.

The other seven threshold voltage distributions (data states) S1-S7 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In some implementations, data values are assigned to the threshold voltage ranges using a Gray code assignment so that if the threshold voltage of a memory erroneously shifts to its neighboring data state, only one bit is affected.

FIG. 5 also shows seven read reference voltages (also referred to as read compare voltages) Vr1, Vr2, Vr3, Vr4, Vr5, Vr6, and Vr7, for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 5 also shows seven verify reference voltages (also referred to as program verify targets) Vv1, Vv2, Vv3, Vv4, Vv5, Vv6, and Vv7. When programming memory cells to data state S1, the system tests whether those memory cells have a threshold voltage greater than or equal to Vv1. When programming memory cells to data state S2, the system tests whether the memory cells have threshold voltages greater than or equal to Vv2. When programming memory cells to data state S3, the system determines whether memory cells have their threshold voltage greater than or equal to Vv3. When programming memory cells to data state S4, the system tests whether those memory cells have a threshold voltage greater than or equal to Vv4. When programming memory cells to data state S5, the system tests whether those memory cells have a threshold voltage greater than or equal to Vv5. When programming memory cells to data state S6, the system tests whether those memory cells have a threshold voltage greater than or equal to Vv6. When programming memory cells to data state S7, the system tests whether those memory cells have a threshold voltage greater than or equal to Vv7.

Example voltages for FIG. 5 are Vr1=0 v, Vr2=1 v, Vr3=2 v, Vr4=3 v, Vr5=4 v, Vr6=5 v, Vr7=6 v, Vv1=0.4 v, Vv2=1.4 v, Vv3=2.4 v, Vv4=3.4 v, Vv5=4.4 v, and Vv6=5.4 v, Vv7=6.4 v.

In some implementations, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7.

For example, while some memory cells are being programmed from data state S0 to data state S1, other memory cells are being programmed from data state S0 to data state S2 and/or from data state S0 to data state S3, and so on. The arrows coming from data state S0 in FIG. 5 represent the full sequence programming. The technology described herein can also be used with other types of programming in addition to full sequence programming (including, but not limited to, multiple stage/phase programming). In some implementations, data states S1-S7 can overlap, with controller 102 relying on an ECC algorithm and soft sensing (described in more detail below) to identify the correct data.

Figure 6A:
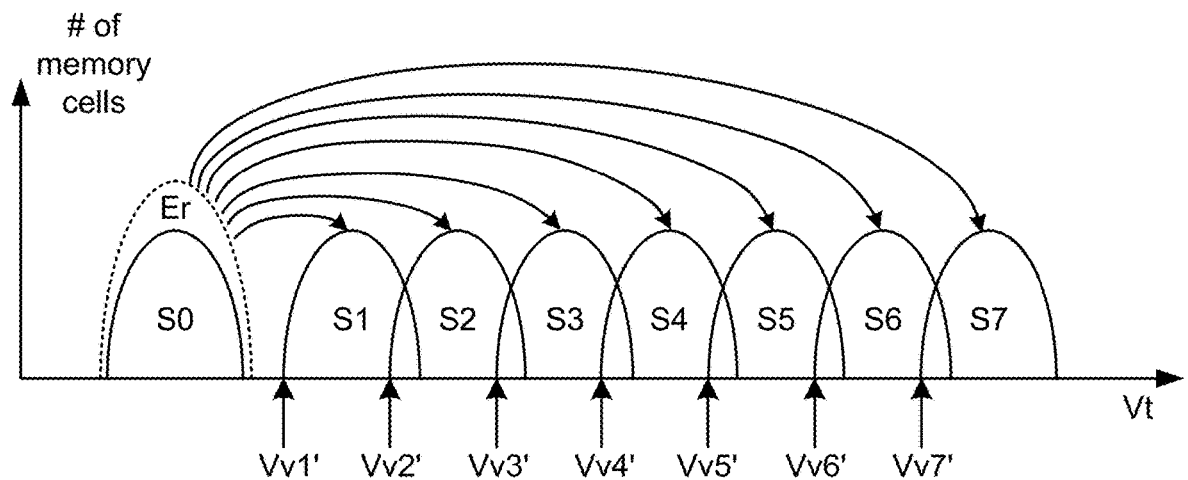
FIG. 6A depicts the first phase of a multiphase programming operation, which includes programming the memory cells from the erased state (S0) to any of the programmed data states S1-S7, similar to full sequence programming, in accordance with some implementations.

FIG. 6A depicts the first phase of a multiphase programming operation, which includes programming the memory cells from the erased state (S0) to any of the programmed data states S1-S7, similar to full sequence programming, in accordance with some implementations. However, rather than using the standard verify reference voltages (e.g., Vv1, Vv2, Vv3, Vv4, Vv5, Vv6, and Vv7), the process of FIG. 6A uses an alternate set of verify reference voltages (e.g., Vv1', Vv2', Vv3', Vv4,' Vv5', Vv6', and Vv7') that are each slightly lower than the corresponding standard verify reference voltage. Thus, the threshold voltages of FIG. 6A can be thought of as intermediate threshold voltage distributions (or intermediate data states) that are at lower voltages than the threshold voltages of FIG. 5. Note that memory cells in the erased state S0 that are to be in data state S0, are inhibited from programming.

Figure 6B:
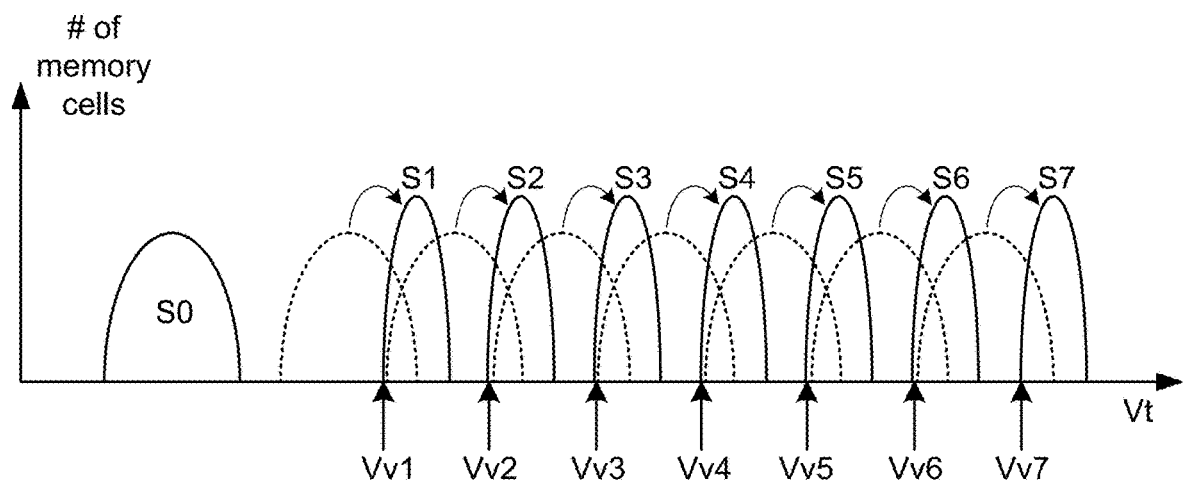
FIG. 6B depicts the second (and last) phase of the multiphase programming operation, which includes programming the memory cells to tighten (decrease the width of) the threshold distributions, in accordance with some implementations.

FIG. 6B depicts the second (and last) phase of the multiphase programming operation, which includes programming the memory cells to tighten (decrease the width of) the threshold distributions, in accordance with some implementations. Thus, the memory cells are programmed from (i) the intermediate threshold voltage distributions (or data states) of FIG. 6A using the alternate set of verify reference voltages (e.g., Vv1', Vv2', Vv3', Vv4,' Vv5', Vv6', and Vv7') to (ii) the final or target threshold voltage distributions (or data states) of FIG. 6B using the standard verify reference voltages (e.g., Vv1, Vv2, Vv3, Vv4, Vv5, Vv6, and Vv7). FIG. 6A may be referred to as the coarse, rough, foggy, or intermediate phase, and FIG. 6B may be referred to as the final, target, fine, or high-accuracy phase.

In some implementations, the coarse phase of FIG. 6A is performed for a given word line, followed by the coarse phase for the next word line. The coarse phase for the next word line could give rise to interference for the given word line, thereby widening the intermediate threshold voltage distributions, which could lead to errors when reading the data. However, the fine phase of a given word line may subsequently be performed after the coarse phase for the next word line, removing or reducing the effects of interference from the next word line. Note that memory cells in the erased state Er that are to be in data state S0 are inhibited from programming.

In some implementations, the coarse-fine program scheme is implemented in a Bit-Cost-Scalable (BiCs) architecture. FIGS. 6A and 6B depict an example in which memory cells are programmed to three bits per memory cell. In some implementations, memory cells are programmed to four bits per memory cell (referred to herein as "QLC", quad level cell). A coarse-fine program scheme can compensate for Neighbor Word line Interference ("NWI") effect significantly by reducing the threshold voltage (Vt) difference between coarse and fine. A coarse-fine program scheme may be used to program memory cells that store two, three, four, five, or more than five bits per cell.

In some implementations after performing the first programming phase depicted in FIG. 6A on a given word line, the first programming phase depicted in FIG. 6A is performed on another word line that is later in the sequence. Afterwards, the second programming phase depicted in FIG. 6B is performed on the given word line.

Figure 7A:
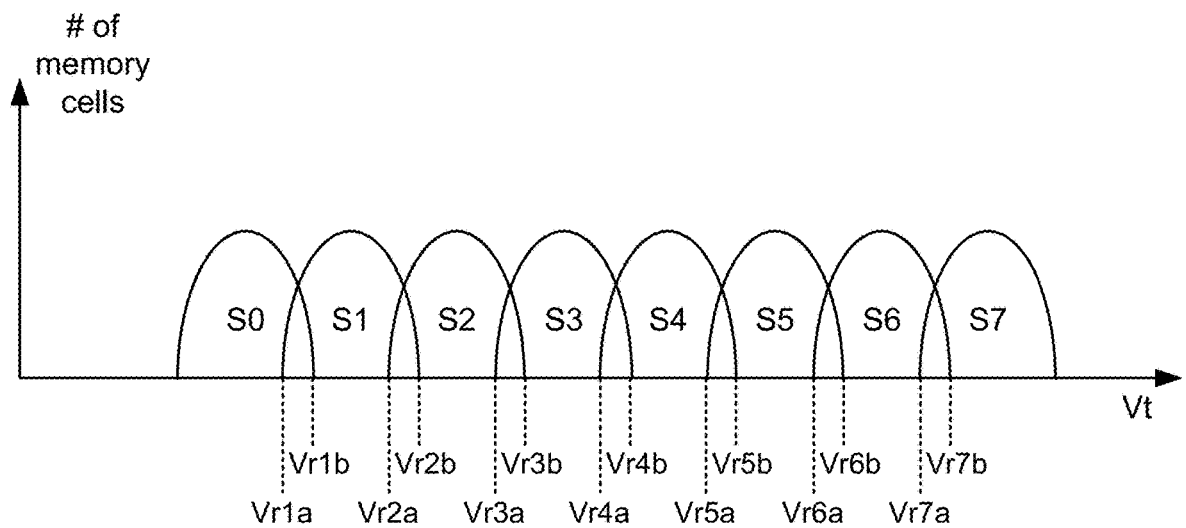
FIG. 7A illustrates example threshold voltage distributions (ranges) for TLC memory cells that store three bits of data, in which the distributions overlap in accordance with some implementations.

FIG. 7A illustrates example threshold voltage distributions (ranges) for TLC memory cells that store three bits of data, in which the distributions overlap in accordance with some implementations. The distributions in FIG. 7A may be the result of a single-phase full-sequence programming operation, or the first phase of a multiphase programming operation. Refining the distributions to minimize or eliminate overlap (e.g., by applying successive programming pulses, performing additional programming phases, and so forth) takes additional time and power. As a result, cell distributions may be left overlapping, with storage controller 102 relying on an ECC algorithm and soft sensing to identify the correct data.

In some implementations, soft sensing comprises a double sense scheme in which the overlapping portion between two neighboring distributions is subjected to two sensing operations. By comparing the threshold voltages of the memory cells being read to two read reference voltages (e.g., Vr1$a$ and Vr1$b$), a cell may be determined to be completely in one of the two distributions (e.g., in S0 or S1), or within the overlapping portion of the two distributions.

Specifically, a first sensing operation may be applied using read reference voltage Vr1$a$ and a second sensing operation may be applied using read reference voltage Vr1$b$ in order to determine which cells are in state S0, state S1, or in the overlapping region between states S0 and S1. A first sensing operation may be applied using read reference voltage Vr2$a$ and a second sensing operation may be applied using read reference voltage Vr2$b$ in order to determine which cells are in state S1, state S2, or in the overlapping region between states S1 and S2, and so forth.

Figure 7B:
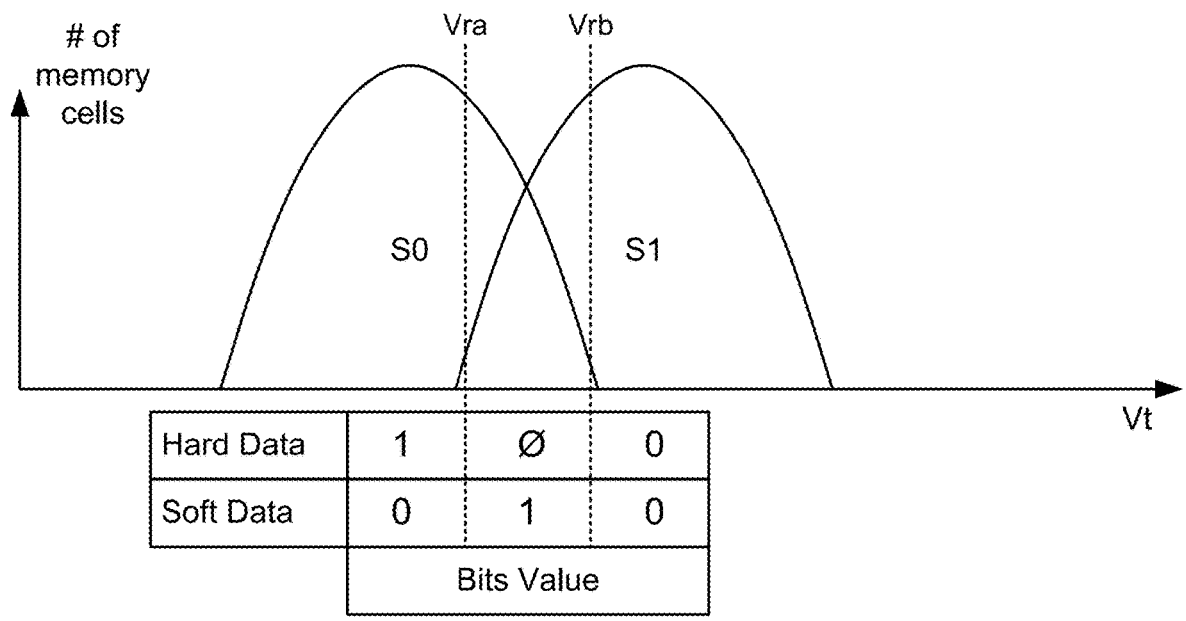
FIG. 7B illustrates a soft sensing coding scheme in accordance with some implementations.

FIG. 7B illustrates a soft sensing coding scheme in accordance with some implementations. In two neighboring distributions (e.g., representing data states S0 and S1), a first sensing operation may be applied using read reference voltage Vra and a second sensing operation may be applied using read reference voltage Vrb in order to determine which cells are in state S0, which cells are in state S1, and which cells are in the overlapping region between states S0 and S1.

Memory cells having threshold voltages that are completely in distribution S0 (less than Vra) and distribution S1 (greater than Vrb) may be represented by hard data bits (e.g., 1 and 0 for an SLC scheme, or other combinations of bits for other schemes as appropriate). Memory cells having threshold voltages that are not in the overlapping portion of the distributions (between Vra and Vrb) are not represented by hard data. Instead, such cells are represented by soft data.

Specifically, cells represented by hard data (as a result of being in one distribution or the other) may be represented by a soft data bit 0, and cells not represented by hard data (as a result of being in the overlapping portion of the distributions) may be represented by a soft data bit 1. When data is read from the storage medium 104, the hard data and soft data for memory cells to be read are provided to the control circuitry 310 (FIG. 3) and/or the decoder 234 (FIG. 2), where the ECC 224 interprets the soft data cells in order to identify which state they represent.

The hard data streams and soft data streams may be separately processed and provided to the storage controller 102. Since the overlapping areas of neighboring distributions represent a relatively small proportion of the total area of the cell voltage distributions as a whole, soft data streams comprise mostly 0s. As such, soft data streams may be compressed using compression algorithms optimized for streams having sparse 1s, before being transmitted to the storage controller 102.

As discussed above (with reference to FIGS. 2-3), data to be written or read is conveyed across channel 114 via the memory interface 230 when the storage controller 102 writes data to and reads data from the storage medium 104. The interface 230 and channel 114 can be a performance bottleneck in read and write operations, negatively affecting data transmission speeds between the storage controller 102 and the storage medium 104. As such, various techniques for optimizing performance at the interface between the storage controller 102 and the storage medium 104 are described herein.

In some implementations, data to be read from the storage medium 104 may be converted to a format that is optimized for compression, and compressed (e.g., by an encoder in the control circuitry 310 of the storage medium 104 or an encoder 234 of the storage controller 102) before being conveyed to the storage controller 102. In some implementations, the data to be read may be converted to a soft data format (as described above with reference to FIG. 7B).

Since soft data is a sparse vector of mostly logic 0s, soft data is more compressible than hard data, which is usually balanced between logic 0s and logic 1s. Soft data can be compressed using, for example, a compression scheme that counts logic 1s and marks the counted 1s using N-bit indicators.

Figure 8A:
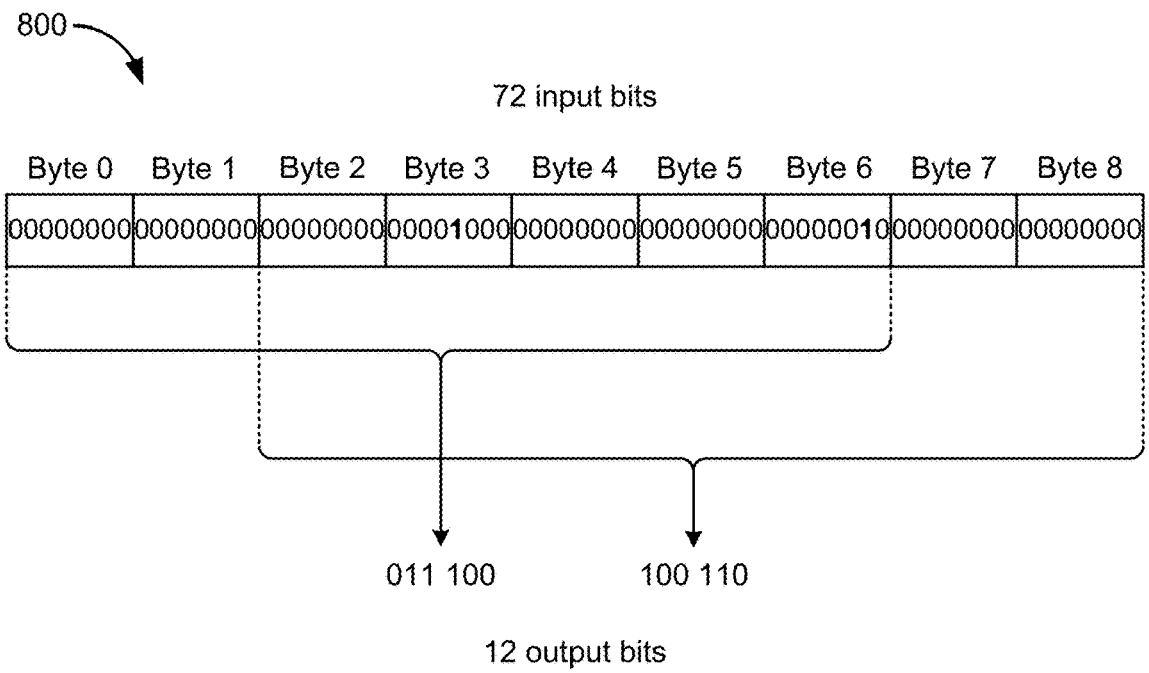
FIGS. 8A-8B are diagrams of example soft bit compression schemes in accordance with some implementations.

FIG. 8A is a diagram of an example soft bit compression scheme 800 in accordance with some implementations. Scheme 800 compresses 72 input bits (soft bits corresponding to hard data read from the memory array 350) to 12 output bits (compressed for transmission to the storage controller 102 via interface channel 114).

Multiple encoding units (also referred to as compressors) may implement scheme 800 in parallel. For example, two encoding units may compress 144 input bits to 24 output bits (referred to as 144-to-24 bit compression). Such a scheme may be implemented using two 72-to-12 bit encoding units executing scheme 800. The encoding units implementing scheme 800 may be implemented in the control circuitry 310 of the storage medium 104 (FIG. 3).

Each encoding unit implementing scheme 800 counts up to two 1s for sets of nine bytes (byte 0 through byte 8). The first 1 is counted in a subset of the first seven bytes (bytes 0 through 6) of the set of nine bytes, and the second 1 is counted in a subset of the last seven bytes (bytes 2-8) of the set of nine bytes. A first six-bit indicator marks the first 1 (3 bits to indicate the byte and 3 bits to indicate the bit within the byte), and a second six-bit indicator marks the second 1 (3 bits to indicate the byte and 3 bits to indicate the bit within the byte).

A byte indicator of between 0-6 (binary 000-110) indicates in which byte a logic 1 appears, and a byte index of 7 (logic 111) indicates that no bytes include a logic 1.

A bit indicator of 0-7 (logic 000-111) indicates which bit of the byte (identified by the byte indicator) is a logic 1.

In the example depicted in FIG. 8A, the first indicator 011 100 includes a byte indicator 011 indicating the fourth byte (byte 3) within the first subset of bytes (bytes 0-6), and a bit indicator 100 indicating that the fifth bit within that byte is a logic 1.

The second indicator 100 110 includes a byte indicator 100 indicating the fifth byte (byte 6) within the second subset of bytes (bytes 2-8), and a bit indicator 110 indicating that the seventh bit within that byte is a logic 1.

For scenarios in which there are two 1s in the first two bytes of a set of nine bytes (bytes 0 and 1) or two 1s in the last two bytes of a set of nine bytes (bytes 7 and 8), only the first of the two 1s is indicated, and the second of the two 1s is not captured in the output stream (referred to as under-marked).

The aforementioned example is described in the context of a 144-bit data bus (using 144-to-24 bit compression). However, scheme 800 may also be implemented in other configurations, including on a 128-bit data bus or a 160-bit data bus. The 144-bit example implementation described herein is not meant to be limiting.

Figure 8B:
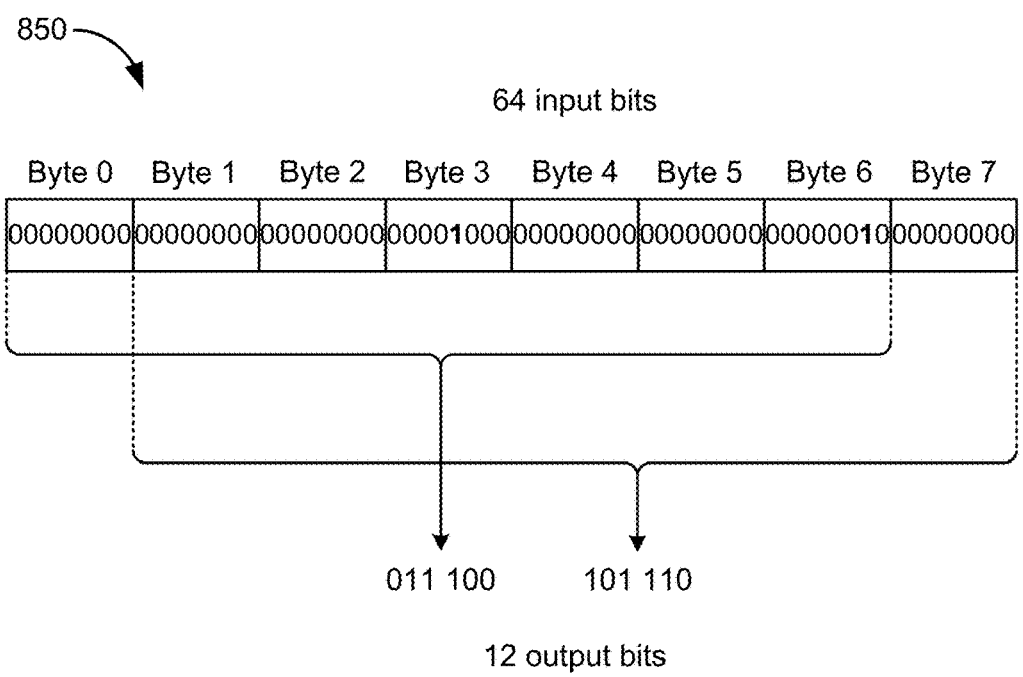

FIG. 8B is a diagram of an example soft bit compression scheme 850 in accordance with some implementations. Scheme 850 uses the same concept to compress input bits (soft bits corresponding to hard data read from the memory array 350), but instead of performing 72-to-12 bit compression, scheme 850 performs 64-to-12 bit compression.

Multiple encoding units (also referred to as compressors) may implement scheme 850 in parallel. For example, two encoding units may compress 128 input bits to 24 output bits (referred to as 128-to-24 bit compression). Such a scheme may be implemented using two 64-to-12 bit encoding units executing scheme 850. The encoding units implementing scheme 850 may be implemented in the control circuitry 310 of the storage medium 104 (FIG. 3).

Each encoding unit implementing scheme 850 counts up to two 1s for sets of eight bytes (byte 0 through byte 7). The first 1 is counted in a subset of the first seven bytes (bytes 0 through 6) of the set of eight bytes, and the second 1 is counted in a subset of the last seven bytes (bytes 1-7) of the set of eight bytes. A first six-bit indicator marks the first 1 (3 bits to indicate the byte and 3 bits to indicate the bit within the byte), and a second six-bit indicator marks the second 1 (3 bits to indicate the byte and 3 bits to indicate the bit within the byte).

A byte indicator of between 0-6 (binary 000-110) indicates in which byte a logic 1 appears, and a byte index of 7 (logic 111) indicates that no bytes include a logic 1.

A bit indicator of 0-7 (logic 000-111) indicates which bit of the byte (identified by the byte indicator) is a logic 1.

In the example depicted in FIG. 8B, the first indicator 011 100 includes a byte indicator 011 indicating the fourth byte (byte 3) within the first subset of bytes (bytes 0-6), and a bit indicator 100 indicating that the fifth bit within that byte is a logic 1.

The second indicator 101 110 includes a byte indicator 101 indicating the sixth byte (byte 6) within the second subset of bytes (bytes 1-7), and a bit indicator 110 indicating that the seventh bit within that byte is a logic 1.

For scenarios in which there are two 1s in the first byte of a set of eight bytes (byte 0) or two 1s in the last byte of a set of eight bytes (byte 7), only the first of the two 1s is indicated, and the second of the two 1s is not captured in the output stream (referred to as under-marked).

Soft bit encoding schemes, such as schemes 800 and 850 described above, can result in high compression rates that make it difficult to output compressed data directly to the storage controller 102. Instead, the control circuitry 310 of the storage medium 104 may need to locally store the compressed soft bit data before transmitting it to the storage controller 102.

Figure 9:
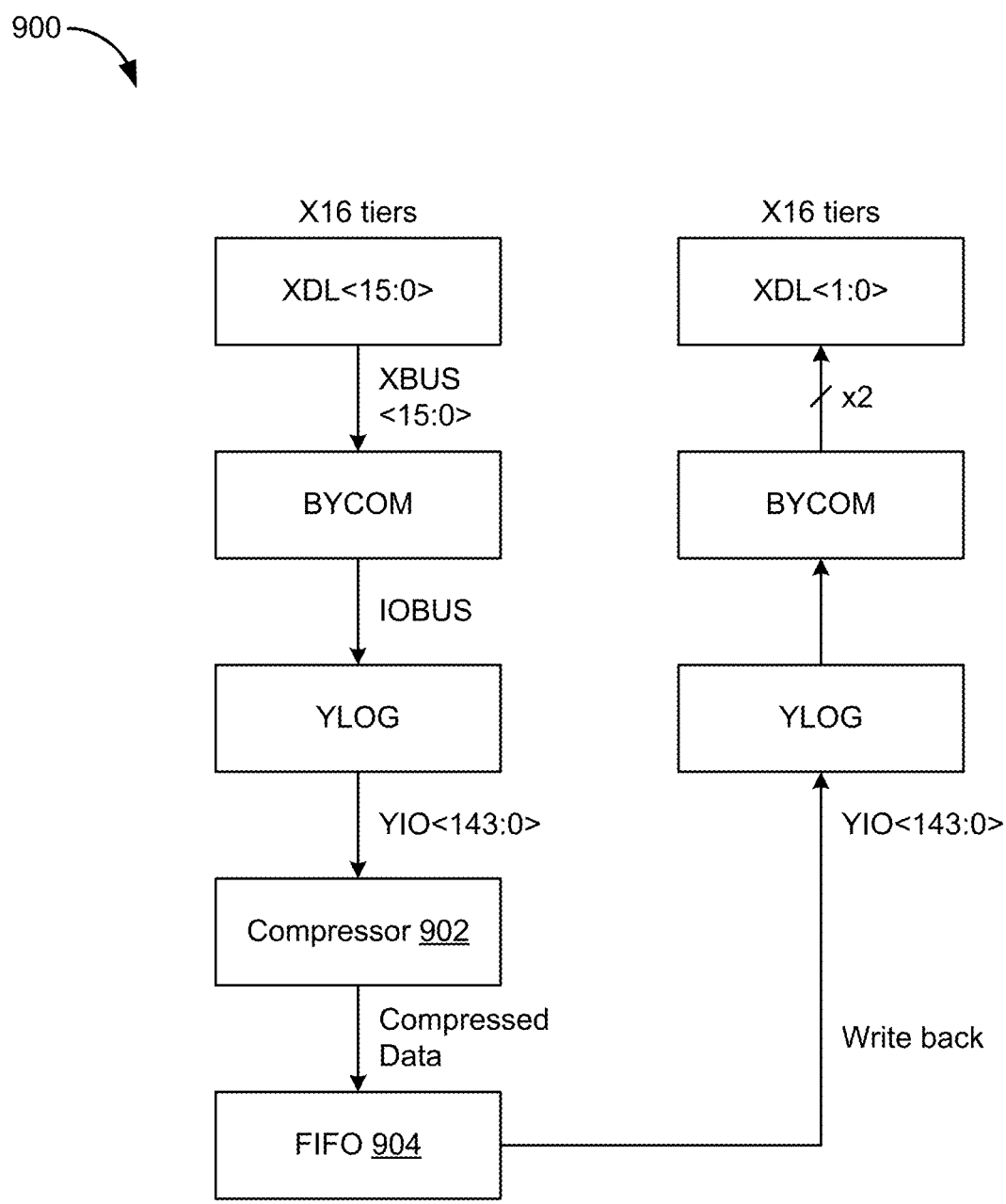
FIG. 9 is a diagram of a soft bit compression storage scheme 900 in accordance with some implementations.

FIG. 9 is a diagram of a soft bit compression storage scheme 900 in accordance with some implementations. The storage scheme 900 may be implemented at the control circuitry 310 of the storage medium 104.

In response to a read command received from the storage controller 102, the control circuitry 310 causes data (in the memory array 350) at addresses specified by the read command to be accessed by latch circuits (XDL) associated with the specified addresses. Using a 16-tier data path as an example, the latches XDL transfer 16 bits of the requested data (bits 15:0) to access circuitry (BYCOM), which transfers the data to a memory column controller (YLOG) via a data bus (IOBUS).

The column controller YLOG transfers soft data associated with the data read to a compressor 902 (also referred to as an encoder or encoding unit), which compresses the soft data (e.g., using scheme 800 described above). In some implementations, the column controller YLOG may perform bad column correction prior to transferring the soft data to the compressor 902.

A first-in-first-out (FIFO) buffer 904 stores the compressed data before it can be transferred to the storage controller 102 over the channel 114. The FIFO buffer may correspond to I/O buffer 332 described above with reference to FIG. 3.

In some implementations, the buffer 904 has a capacity equal to the data bus width. The buffer transmits data as it fills up. When the buffer is full, the compressor stops compressing data, at which time uncompressed data at the input of the compressor is written back to the data latch(es) XDL (referred to as a write-back operation) via the YLOG and BYCOM.

In some implementations, write-back causes the uncompressed data to be written back to a subset of the data latches XDL that initially latched the data read from the memory array 350 as a result of the read command (e.g., latches corresponding to bits 1:0). For example, if the read command specified columns 0-15, latches associated with columns 0-15 would latch the data and provide the data for compression at the compressor 902. The uncompressed data (while the buffer 904 is full) would be written back to the latch associated with column 0, and then the latch associated with column 1 (if necessary), and so forth, which overwrites the data that was initially stored in those latches when the data was latched from the memory array 350.

During write-back, the buffer 904 continues to transmit data, which adds more space to the buffer. When write-back is finished, the compressor 902 resumes compressing data stored in the latches XDL and storing it in the buffer 904 for transmission to the storage controller 102.

Figure 10:
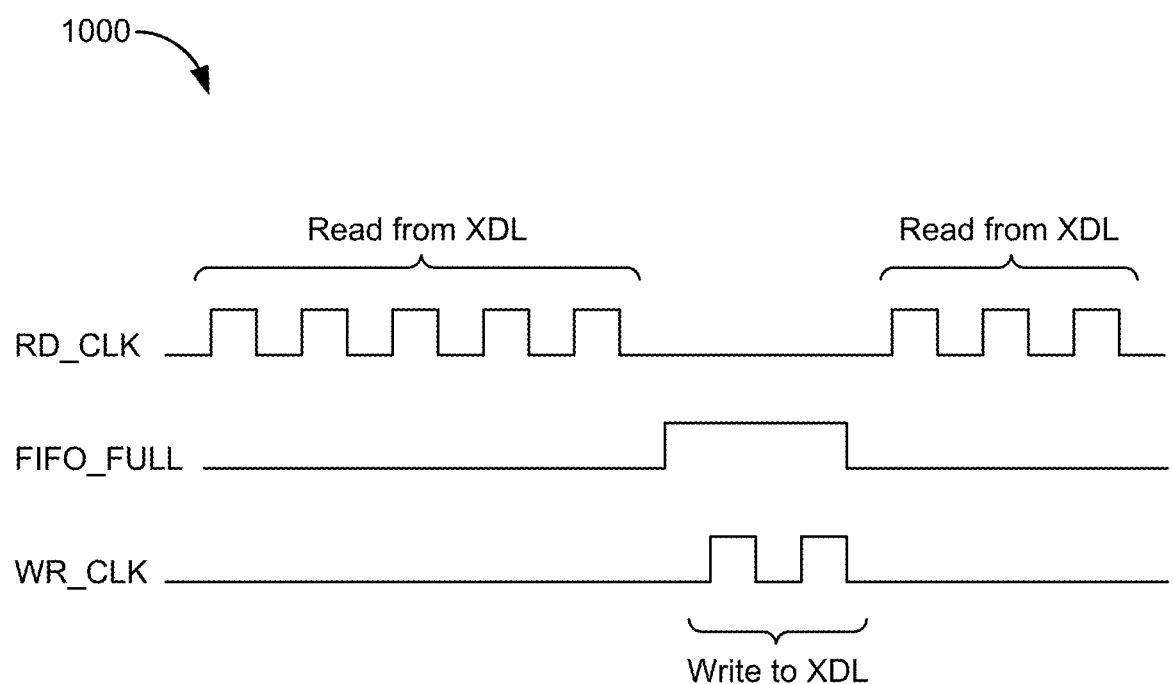
FIG. 10 is an example timing diagram 1000 corresponding to the compression storage scheme 900 in accordance with some implementations.

FIG. 10 is an example timing diagram 1000 corresponding to the compression storage scheme 900 in accordance with some implementations. While reading from the data latches XDL, a read clock (RD_CLK) is active. The number of read clocks depends on the data bus width.

When the buffer 904 is full, a buffer full signal (FIFO_FULL) is asserted, which causes write-back to begin. During write-back, a write clock (WR_CLK) is active. The compressor 902 stops compression and the soft bit data (from column 0) is overwritten. Upon completion of write-back, reading and compression are resumed and the read clock is re-enabled.

The compression storage scheme 900 described above adds latency due to use of a FIFO buffer 904 to temporarily store compressed data before transmitting it to the storage controller 102.

Figure 11:
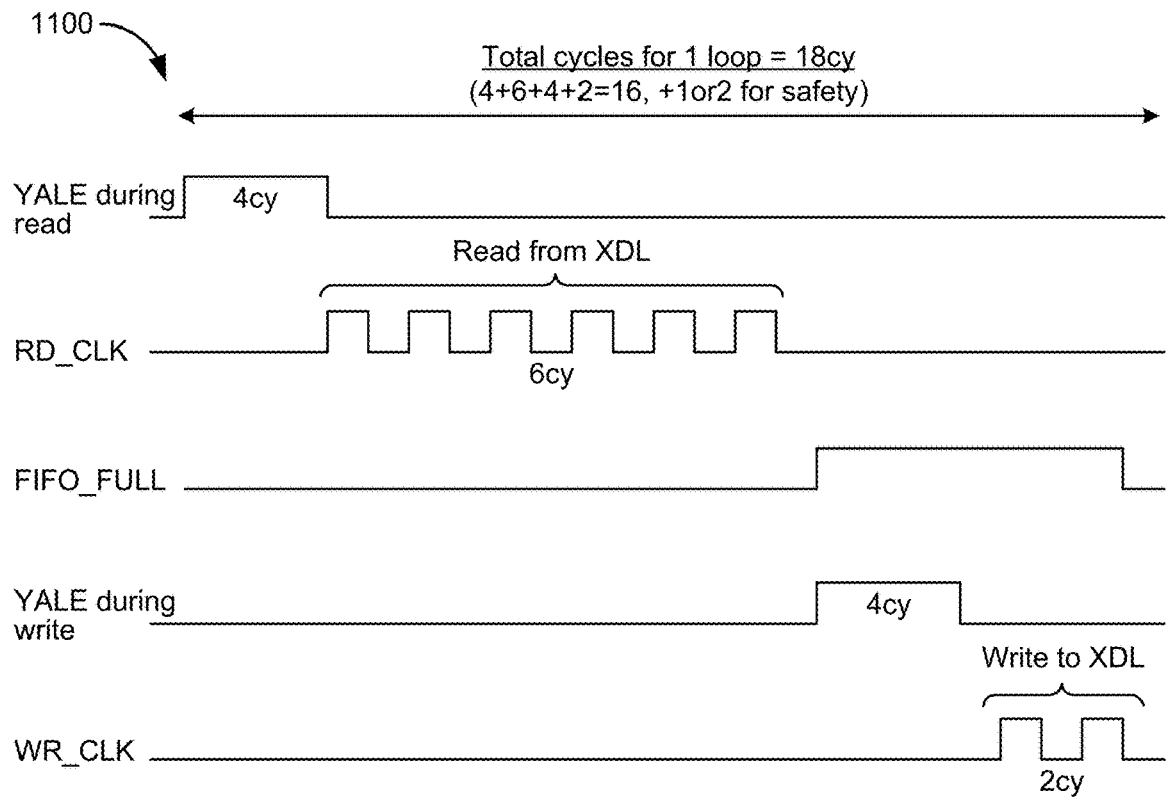
FIG. 11 is an example timing diagram 1100 demonstrating the effects of this latency in accordance with some implementations.

FIG. 11 is an example timing diagram 1100 demonstrating the effects of this latency in accordance with some implementations. Timing diagram 1100 corresponds to a 144-bit bus and 144-to-24 bit compression.

Upon receiving a read command from the storage controller 102, an address latch enable signal (YALE) is asserted, during which addresses associated with the read command are latched into an address register (e.g., of the address decoder 314 and/or row/column decoders 324/326). For a 144-bit bus, the YALE signal may be required to be asserted for 4 cycles.

Subsequent to the latching of addresses, a read clock (RD_CLK) is cycled n times (e.g., 6 cycles for a 144-bit bus) during reading from the XDL. When the FIFO buffer 904 is full, a buffer full signal (FIFO_FULL) is asserted, which triggers a write-back operation.

For the write-back operation, an address latch enable signal (YALE) is asserted, during which addresses associated with the write-back operation are latched into an address register (e.g., of the address decoder 314 and/or row/column decoders 324/326). For a 144-bit bus, the YALE signal may be required to be asserted for 4 cycles.

Subsequent to the latching of addresses, a write clock (WR_CLK) is cycled during writing to the XDL. Adding another 1 to 2 cycles for safety (dummy cycles), 18 cycles are required to compress 6×144 bits (4 read address cycles, 6 read cycles, 4 write address cycles, 2 write-back cycles, and 2 dummy cycles). As such, for a 144-bit bus, 2845 cycles would be required to compress 19800 bytes, which results in 26 us of latency.

Figure 12:
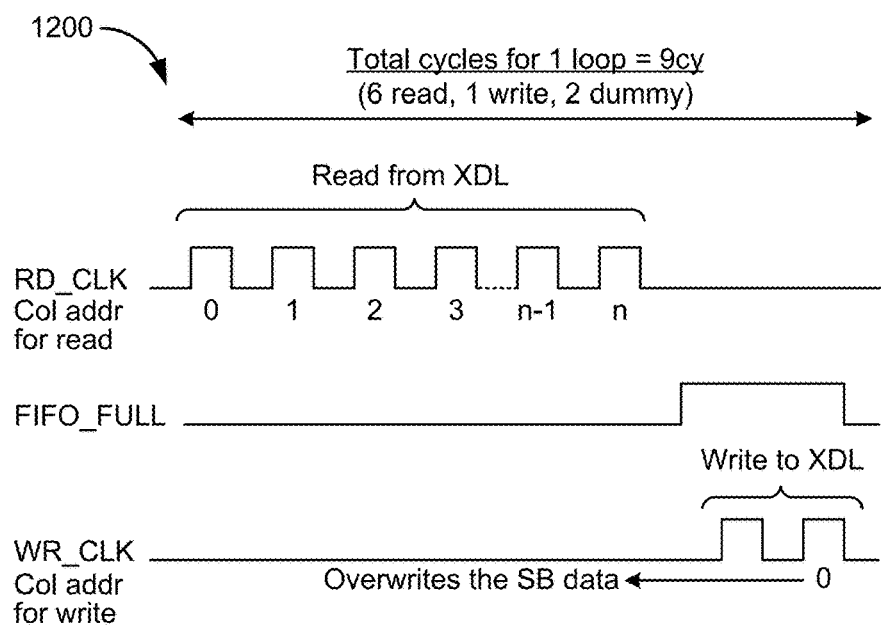
FIG. 12 is an example timing diagram 1200 demonstrating the effects of a latency reduction scheme in accordance with some implementations.

FIG. 12 is an example timing diagram 1200 demonstrating the effects of a latency reduction scheme in accordance with some implementations. The latency reduction scheme includes removing the YALE cycles (4 read address cycles+4 write address cycles=8 cycles) from each loop. Instead of using YALE signals to latch read and write addresses, the latency reduction scheme includes adding (setting) additional address pointers to support simultaneous reading and writing of data. Stated another way, addresses for read and write-back operations are specified by address pointers.

For purposes of comparison with the previous timing diagram 1100, timing diagram 1200 corresponds to a 144-bit bus and 144-to-24 bit compression. Upon receiving a read command from the storage controller 102, a read clock (RD_CLK) is cycled n times (e.g., 6 cycles for a 144-bit bus) during reading from the XDL. When the FIFO buffer 904 is full, a buffer full signal (FIFO_FULL) is asserted, which triggers a write-back operation.

Upon the FIFO buffer being full (e.g., when storing 6×144 bits), a write clock (WR_CLK) is cycled during writing to the XDL. Data may be written back for 1 cycle.

Adding another 1 to 2 cycles for safety (dummy cycles between read-write and write-read operations), only 9 cycles are required to compress 6×144 bits (6 read cycles, 1 write-back cycle, and 2 dummy cycles). If a single clock cycle is 8 ns, then the total time taken to compress 19800 bytes is 12.7 us, which represents a decrease in latency (compared to the 26 us of latency in scheme 1100 described above with reference to FIG. 11).

The address pointers specify column addresses for read operations (e.g., column 0, column 1, . . . column n), and column addresses for write-back operations (e.g., column 0). The write-back operation depicted in the example is associated with a pointer that specifies the first column that was read from (column 0).

FIG. 13 is a table 1300 showing three compression schemes and their corresponding latencies, as well as areas, compression ratios, buffer depths, and correctable bit-error rates (BER) in accordance with some implementations.

In a first compression scheme (160-to-32 bit compression), the area required to implement the operations described above (not including the buffer 904) is approximately 7000 micrometers (um), resulting in a 20% compression ratio and greater than 0.9 correctable bit-error rate (BER), with a buffer depth of 20 bytes and latency of 12.2 microseconds (us).

In a second compression scheme (144-to-24 bit compression), the area required to implement the operations described above (not including the buffer 904) is approximately 3200 micrometers (um), resulting in a 16.67% compression ratio and greater than 0.9 correctable bit-error rate (BER), with a buffer depth of 18 bytes and latency of 12.7 microseconds (us).

In a third compression scheme (128-to-24 bit compression), the area required to implement the operations described above (not including the buffer 904) is approximately 3400 micrometers (um), resulting in an 18.75% compression ratio and greater than 0.9 correctable bit-error rate (BER), with a buffer depth of 18 bytes and latency of 12.7 microseconds (us).

In some implementations, error correction using corrected read data (CRD) is disabled during write-back operations. As such, CRD correction is only applied while reading data. Disabling CRD correction during write-back may reduce design complexity. Otherwise, to have CRD correction during write-back, the storage scheme would require duplicate CRD pointers to handle writes separately, which would require additional area and complexity.

In some implementations, the storage controller 102 performs XDL read out as soon as soft bit compression is finished.

Since compressed soft bit data is not programmed to the memory array 350, only bad columns of data caused by XDL defects may cause data errors. Such XDL defects have a relatively low probability of occurring (e.g., less than 0.05%). As such, correction capability of the ECC module 224 of the storage controller 102 may be slightly impacted, but improvements in area and complexity requirements (as described in table 1300) balance out these impacts.

Figure 14:
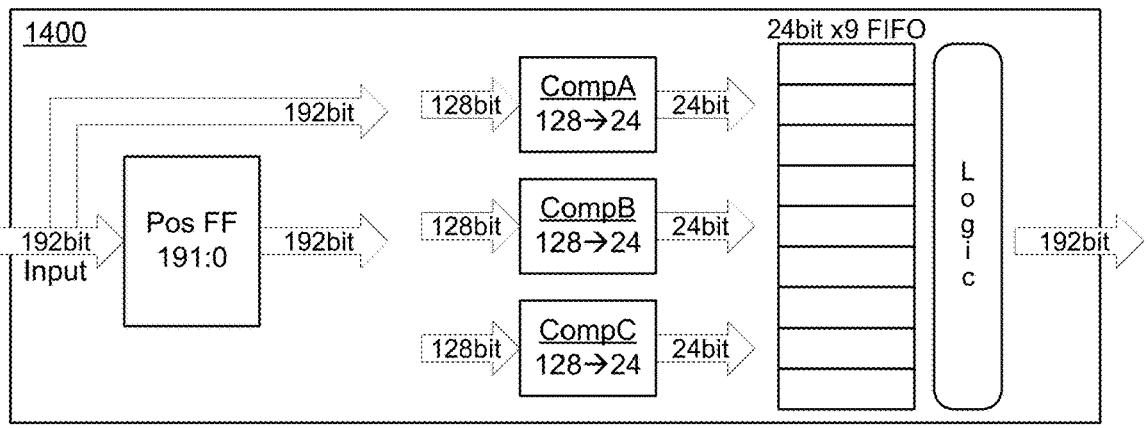
FIG. 14 is a block diagram of soft bit compression circuitry 1400 including three compressors in accordance with some implementations.

FIG. 14 is a block diagram of soft bit compression circuitry 1400 in accordance with some implementations. Compression circuitry 1400 may be implemented at the control circuitry 310 of the storage medium 104 (FIG. 3), and can be used for scenarios in which the data bus has a different width than compression blocks (encoding units) available to the control circuitry 310.

In the example in FIG. 14, an 10 bus (e.g., YIO, FIG. 9) receives a 192-bit input stream of soft bit data, but the compression blocks are configured to compress groups of 128 bits. Compression circuitry 1400 addresses this mismatch by using a plurality of compressors (CompA, CompB, and CompC), the number of which (three) is determined by the least common multiple of 192 and 128. The compressors may be similar in function to compressor 902 (FIG. 9).

The least common multiple of 192 (the width of the IO bus) and 128 (the width of the compressors) is 384, which is 2*192 and 3*128. As such, by implementing three compressors and a block of flip flops (Pos FF) to store 192 bits at a time, the compression circuitry 1400 forms the equivalent of a 384-bit bus. Specifically, every other cycle of 192-bit input data is stored in the flip flops, so the stored bits may be combined with subsequently received 192 bits of input data to provide 384 bits of data at a time. The 384 bits are split between the three compressors CompA, CompB, and CompC, which each compress 128 bits to 24 bits (e.g., by using two instances of compression scheme 850, FIG. 8B).

Each compressor outputs 24 bits of compressed soft bit data at a time to a FIFO buffer (corresponding to FIFO 904, FIG. 9). When the buffer is filled to at least 192 bits, additional logic outputs the compressed data, 192 bits at a time (sometimes referred to as flushing out the FIFO buffer). The data that is provided for output by the FIFO buffer may subsequently be transmitted to the storage controller 102 via channel 114 (FIG. 3) and/or subjected to write-back operations as described above with reference to FIGS. 9-13.

The compression circuitry 1400 performs with relatively little latency (compared to circuitry 1500 and 1600 described below), but this design is very costly in terms of on-chip area, because each compressor unit requires a relatively large amount of space to implement.

Figure 15:
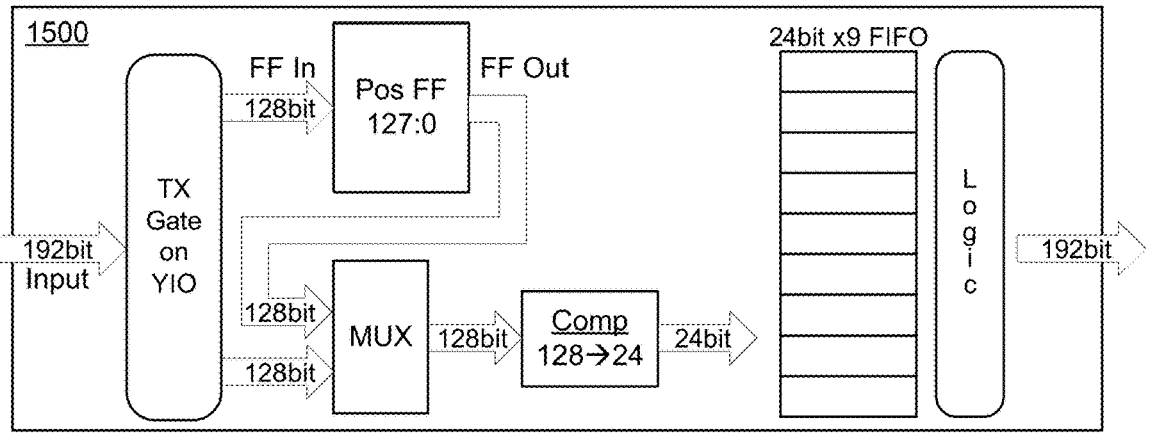
FIG. 15 is a block diagram of soft bit compression circuitry 1500 including one compressor in accordance with some implementations.

FIG. 15 is a block diagram of soft bit compression circuitry 1500 in accordance with some implementations. Compression circuitry 1500 may be implemented at the control circuitry 310 of the storage medium 104 (FIG. 3), and can be used for scenarios in which the data bus has a different width than compression blocks (encoding units) available to the control circuitry 310 (as described above with reference to FIG. 14).

In the example in FIG. 15, an IO bus (e.g., at a TX gate on the YIO bus, FIG. 9) receives a 192-bit input stream of soft bit data, but a compression block is configured to compress groups of 128 bits. Compression circuitry 1500 addresses this mismatch by using one compressor (Comp) and a block of flip flops (Pos FF) to temporarily store the extra input bits that could not be compressed in the compressor until there are enough extra bits to add up to the input bus width. The compressor Comp compresses 128 bits to 24 bits (e.g., by using two instances of compression scheme 850, FIG. 8B).

For a 192-bit bus and a 128-to-24 bit compressor, for every cycle that receives input bits, 64 extra bits are sent to the flip flops (the difference between 192 and 128).

For a first cycle, 192 input bits are received. The compressor compresses 128 of the 192 input bits (via the MUX), and the flip flops store the remaining 64 of the 192 input bits, bringing the total number of bits in the flip flops to 64.

For a second cycle, 192 input bits are received. The compressor compresses 128 bits of the 192 bits (via the MUX), and the flip flops store the remaining 64 bits of the 192 bits, bringing the total number of bits in the flip flops to 128 (64+64).

For a third cycle, instead of processing any additional input bits, the compressor instead compresses the 128 bits stored in the flip flops (via the MUX and FF Out), bring the total number of bits in the flip flops back to 0.

The above three cycles repeat, processing 192 input bits for two out of every three cycles, and processing the extra bits in the flip flops for the third out of every three cycles. As a result, one out of every three cycles does not process any input bits, which introduces latency. Stated another way, every third cycle cannot compress additional input data because every two cycles receive 384 input bits (192+192), but it takes three cycles to finish fully compressing those bits (128+128+128).

The compressor outputs 24 bits of compressed soft bit data at a time to a FIFO buffer (corresponding to FIFO 904, FIG. 9). When the buffer is filled to at least 192 bits, additional logic outputs the compressed data, 192 bits at a time (sometimes referred to as flushing out the FIFO buffer). The data that is provided for output by the FIFO buffer may subsequently be transmitted to the storage controller 102 via channel 114 (FIG. 3) and/or subjected to write-back operations as described above with reference to FIGS. 9-13.

The compression circuitry 1500 is optimized for area (compared to circuitry 1400) because it only has one compressor. However, this area optimization comes at a cost of efficiency due to the extra latency caused by every third cycle not being able to process additional input data (the circuitry must stop reading input bits once every three cycles).

Figure 16:
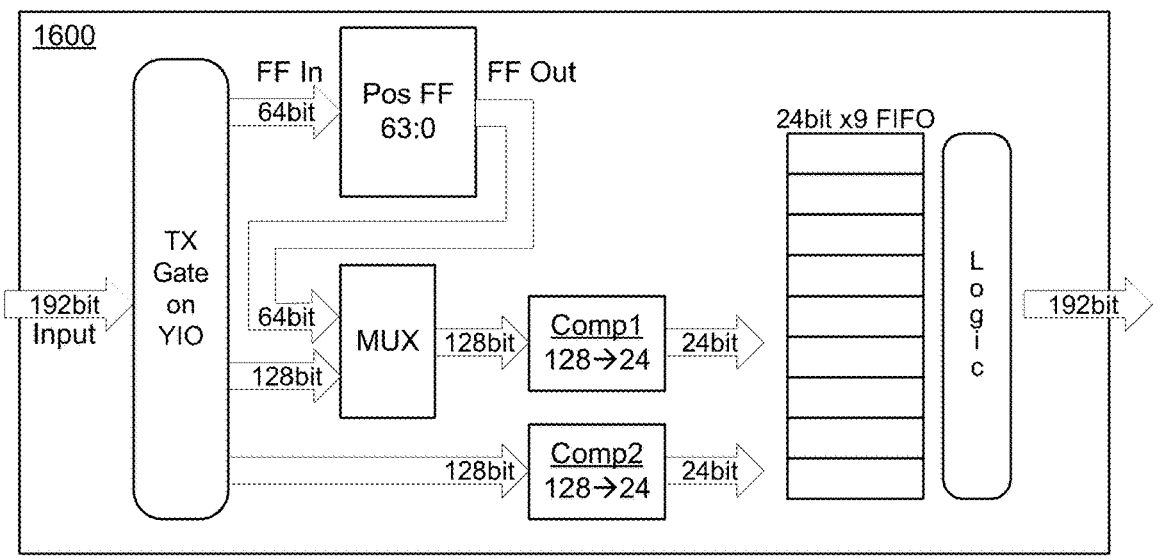
FIG. 16 is a block diagram of soft bit compression circuitry 1600 including two compressors in accordance with some implementations.

FIG. 16 is a block diagram of soft bit compression circuitry 1600 in accordance with some implementations.

Compression circuitry 1600 may be implemented at the control circuitry 310 of the storage medium 104 (FIG. 3), and can be used for scenarios in which the data bus has a different width than compression blocks (encoding units) available to the control circuitry 310 (as described above with reference to FIGS. 14-15).

In the example in FIG. 16, an IO bus (e.g., at a TX gate on the YIO bus, FIG. 9) receives a 192-bit input stream of soft bit data, but compression blocks included in the circuitry 1600 are configured to compress groups of 128 bits. Compression circuitry 1600 addresses this mismatch by using two compressors (Comp1 and Comp2) and a block of flip flops (Pos FF) to temporarily store the extra input bits that could not be compressed in the compressors and provide the extra input bits to one of the compressors every other cycle. The compressors Comp1 and Comp2 each compress 128 bits to 24 bits (e.g., by using two instances of compression scheme 850, FIG. 8B).

For every other cycle (e.g., odd cycles), the first compressor Comp1 compresses 128 of the 192 input bits (via the MUX), and the flip flops store the remaining 64 of the 192 input bits. The second compressor Comp2 is inactive for these cycles.

For every other alternate cycle (e.g., even cycles), the first compressor Comp1 compresses (via the MUX) the 64 bits stored in the flip flops during the previous cycle, and 64 of the 192 input bits received during the current cycle. The second compressor Comp2 compresses the remaining 128 of the 192 input bits received during the current cycle.

The above alternating cycles repeat, processing 192 input bits for each cycle. As a result, each cycle processes 192 input bits, which solves the latency issue described above with reference to circuitry 1500.

The two compressors output 24 bits of compressed soft bit data at a time to a FIFO buffer (corresponding to FIFO 904, FIG. 9). When the buffer is filled to at least 192 bits, additional logic outputs the compressed data, 192 bits at a time (sometimes referred to as flushing out the FIFO buffer). The data that is provided for output by the FIFO buffer may subsequently be transmitted to the storage controller 102 via channel 114 (FIG. 3) and/or subjected to write-back operations as described above with reference to FIGS. 9-13.

While the use of three compressors (circuitry 1400) is the least complicated implementation of the compression circuitry described herein, such a configuration is bad for on-chip area. Further, while the use of one compressor (circuitry 1500) solves the area problem, such a configuration introduces latency. Thus, circuitry 1600 optimizes the trade-off between complexity, area, and latency by using two compressors, where one compressor is used 100% of the time, and the other compressor is used 50% of the time. In addition, the block of flip fops required to temporarily store input bits in circuitry 1600 is only required to be big enough to store only half of the input bits (64) received during each cycle.

Figure 17A:
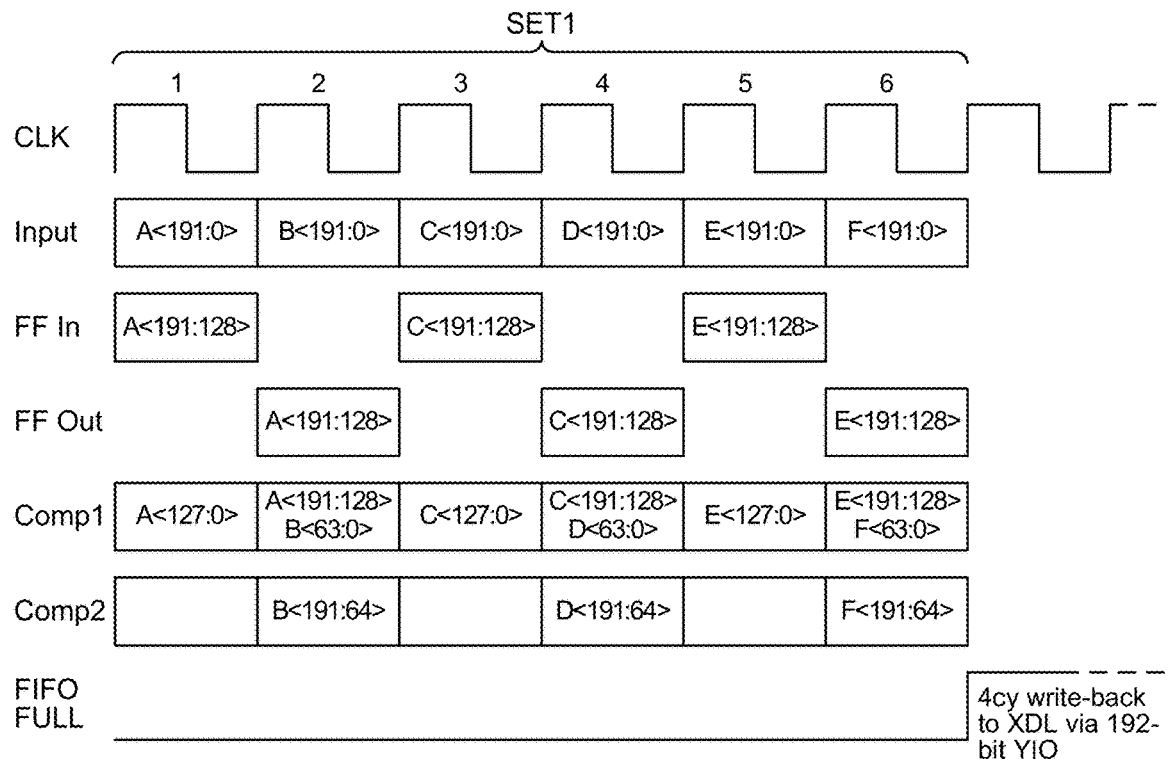
FIGS. 17A-17B depict an example timing diagram corresponding to operation of the compression circuitry 1600 in accordance with some implementations.
Figure 17B:
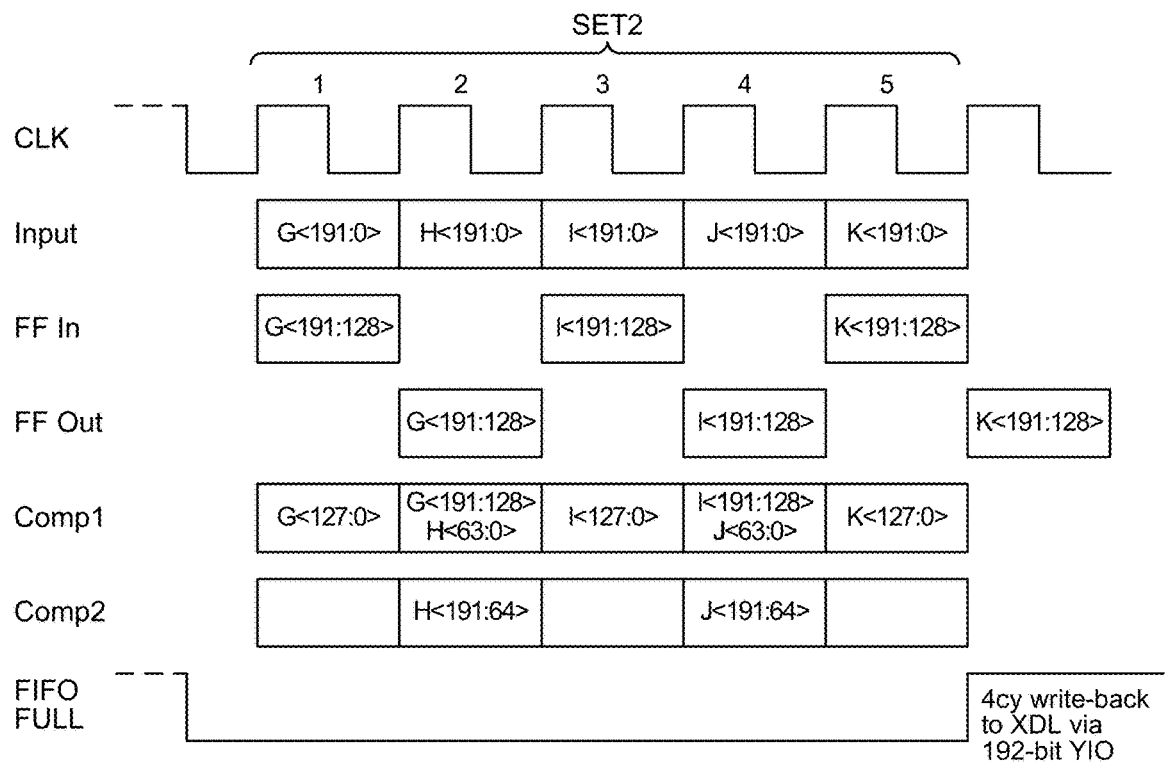

FIGS. 17A-17B depict an example timing diagram corresponding to operation of the compression circuitry 1600 in accordance with some implementations.

For each successive clock cycle in a first set of clock cycles (FIG. 17A), 192 bits of input are received (192 bits labeled A, 192 bits labeled B, 192 bits labeled C, 192 bits labeled D, 192 bits labeled E, and 192 bits labeled F).

For the odd cycles (1, 3, 5), the first compressor Comp1 compresses 128 of the 192 input bits (A, C, E), and the flip flops store the remaining 64 of the 192 input bits (A, C, E). The second compressor Comp2 is inactive for these cycles.

For the even cycles (2, 4, 6), the first compressor Comp1 compresses the 64 bits stored in the flip flops (A, C, E) during the previous cycle (via FF Out), and 64 of the 192 input bits received during the current cycle (B, D, F). The second compressor Comp2 compresses the remaining 128 of the 192 input bits received during the current cycle (B, D, F).

After the sixth clock cycle, a FIFO_FULL signal is asserted for four cycles, triggering write-back operations as described above with reference to FIGS. 9-13. After the write-back operations are complete, a second set of clock cycles occur for compression of additional input data.

For each successive clock cycle in the second set of clock cycles (FIG. 17B), 192 bits of input are received (192 bits labeled G, 192 bits labeled H, 192 bits labeled I, 192 bits labeled J, and 192 bits labeled K).

For the odd cycles (1, 3, 5), the first compressor Comp1 compresses 128 of the 192 input bits (G, I, K), and the flip flops store the remaining 64 of the 192 input bits (G, I, K). The second compressor Comp2 is inactive for these cycles.

For the even cycles (2, 4), the first compressor Comp1 compresses the 64 bits stored in the flip flops (G, I, K) during the previous cycle (via FF Out), and 64 of the 192 input bits received during the current cycle (H, J). The second compressor Comp2 compresses the remaining 128 of the 192 input bits received during the current cycle (H, J).

After the fifth clock cycle, the FIFO_FULL signal is asserted for four cycles, triggering write-back operations as described above with reference to FIGS. 9-13. After the write-back operations are complete, the operations repeat, executing another round of first and second sets of clock cycles for compression of additional input data as described above.

After each round of first and second sets of clock cycles, the FIFO buffer is empty. More specifically, after the first set, 6×192 bits are read (A-F), outputting 9×24 compressed bits to the FIFO buffer. After the second set, 5×192 bits are read (G-K), outputting 7×24 compressed bits to the FIFO buffer. The total number of compressed bits stored in the FIFO buffer over the course of the two sets of clock cycles is 16×24. If after each of the two sets 8×24 bits are conveyed from the FIFO buffer and read onto the YIO bus, then the FIFO buffer (i) does not overflow, and (ii) provides a consistent stream of bits to the YIO bus, which is ideal for efficient operation of the YIO bus and corresponding circuitry.

It will be appreciated by those skilled in the art that changes could be made to the exemplary embodiments shown and described above without departing from the broad inventive concept thereof. It is understood, therefore, that this invention is not limited to the exemplary embodiments shown and described, but it is intended to cover modifications within the spirit and scope of the present invention as defined by the claims. For example, specific features of the exemplary embodiments may or may not be part of the claimed invention, different components as opposed to those specifically mentioned may perform at least some of the features described herein, and features of the disclosed embodiments may be combined. As used herein, the terms "about" and "approximately" may refer to + or −10% of the value referenced. For example, "about 9" is understood to encompass 8.2 and 9.9.

It is to be understood that at least some of the figures and descriptions of the invention have been simplified to focus on elements that are relevant for a clear understanding of the invention, while eliminating, for purposes of clarity, other elements that those of ordinary skill in the art will appreciate may also comprise a portion of the invention. However, because such elements are well known in the art, and because they do not necessarily facilitate a better understanding of the invention, a description of such elements is not provided herein.

It will be understood that, although the terms "first," "second," etc. are sometimes used herein to describe various elements, these elements should not be limited by these terms. These terms are only used to distinguish one element from another. For example, a first element could be termed a second element, and, similarly, a second element could be termed a first element, without changing the meaning of the description, so long as all occurrences of the "first element" are renamed consistently and all occurrences of the second element are renamed consistently. The first element and the second element are both elements, but they are not the same element.

As used herein, the term "if" may be, optionally, construed to mean "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

The terminology used herein is for the purpose of describing particular implementations only and is not intended to be limiting of the claims. As used in the description of the implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

It will be further understood that the terms "comprises" and/or "comprising," when used in this specification, specify the presence of stated features, integers, operations, elements, and/or components, but do not preclude the presence or addition of one or more other features, integers, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

Further, to the extent that the method does not rely on the particular order of steps set forth herein, the particular order of the steps should not be construed as limitation on the claims. The claims directed to the method of the present invention should not be limited to the performance of their steps in the order written, and one skilled in the art can readily appreciate that the steps may be varied and still remain within the spirit and scope of the present invention.

What is claimed is:

1. A data storage system, comprising:
    a storage medium including a plurality of memory cells and an encoder;
    a storage controller in communication with the storage medium; and
    electrical interface circuitry configured to transfer data via a channel disposed between the storage medium and the storage controller;
    the encoder of the storage medium is configured to:
        receive, at a plurality of latches respectively associated with a plurality of memory cells, soft data corresponding to data subject to a read operation specified by the storage controller;
        compress the soft data;
        store the compressed soft data in a buffer before transmitting the compressed soft data to the storage controller;
        upon the buffer being full, write uncompressed soft data back to at least a subset of the plurality of latches; and
        upon completion of the writing of the uncompressed soft data, resume compressing and storing of soft data in the buffer, and transmit the compressed soft data to the storage controller.

2. The data storage system of claim 1, wherein the subset of the plurality of latches includes at least one latch from which the soft data was received.

3. The data storage system of claim 1, wherein the encoder is further configure to:
    associate a plurality of address pointers to the plurality of latches; and
    write the uncompressed soft data back to the subset of the plurality of latches in accordance with the plurality of address pointers.

4. The data storage system of claim 1, wherein the encoder is further configured to disable error correction while writing the uncompressed soft data back to the subset of the plurality of latches.

5. The data storage system of claim 1, wherein:
    the soft data includes a plurality of bytes; and
    the encoder is configured to compress the soft data by:
        indicating a position of a first logic 1 within a first subset of the plurality of bytes; and
        indicating a position of a second logic 1 within a second subset of the plurality of bytes;
        wherein the first and second subsets of the plurality of bytes overlap, the first subset of the plurality of bytes includes a byte not included in the second subset of the plurality of bytes, and the second subset of the plurality of bytes includes a byte not included in the first subset of the plurality of bytes.

6. The data storage system of claim 1, wherein:
    the electrical interface circuitry includes a data path having a first width; and
    the encoder includes two compressors, each compressor configured to compress data in groups of bits associated with a second width different from the first width.

7. The data storage system of claim 6, wherein:
    the encoder further includes a plurality of flip flops;
    a first of the two compressors is configured to alternately (i) compress soft data received during a current cycle and soft data received during a previous cycle stored in the plurality of flip flops, and (ii) compress only soft data received during a current cycle; and
    a second of the two compressors is configured to alternately (i) compress soft data received during a current cycle, and (ii) forgo compression of soft data received during a current cycle.

8. A method of operating a data storage system, comprising:

at an encoder of a storage medium of the data storage system:
  receiving, at a plurality of latches respectively associated with a plurality of memory cells of the storage medium, soft data corresponding to data subject to a read operation specified by a storage controller of the data storage system;
  compressing the soft data;
  storing the compressed soft data in a buffer before transmitting the compressed soft data to the storage controller;
  upon the buffer being full, writing uncompressed soft data back to at least a subset of the plurality of latches; and
  upon completion of the writing of the uncompressed soft data, resume compressing and storing of soft data in the buffer, and transmitting the compressed soft data to the storage controller.

9. The method of claim 8, wherein the subset of the plurality of latches includes at least one latch from which the soft data was received.

10. The method of claim 8, further comprising:
associating a plurality of address pointers to the plurality of latches; and
writing the uncompressed soft data back to the subset of the plurality of latches in accordance with the plurality of address pointers.

11. The method of claim 8, further comprising disabling error correction at the encoder while writing the uncompressed soft data back to the subset of the plurality of latches.

12. The method of claim 8, wherein:
the soft data includes a plurality of bytes; and
compressing the soft data includes:
  indicating a position of a first logic 1 within a first subset of the plurality of bytes; and
  indicating a position of a second logic 1 within a second subset of the plurality of bytes;
  wherein the first and second subsets of the plurality of bytes overlap, the first subset of the plurality of bytes includes a byte not included in the second subset of the plurality of bytes, and the second subset of the plurality of bytes includes a byte not included in the first subset of the plurality of bytes.

13. The method of claim 8, wherein:
electrical interface circuitry of the data storage system includes a data path having a first width; and
the encoder includes two compressors, each compressor configured to compress data in groups of bits associated with a second width different from the first width.

14. The method of claim 13, wherein:
the encoder further includes a plurality of flip flops; and
compressing the soft data further includes:
  at a first of the two compressors, alternately: (i) compressing soft data received during a current cycle and soft data received during a previous cycle stored in the plurality of flip flops, and (ii) compressing only soft data received during a current cycle; and
  at a second of the two compressors, alternately (i) compressing soft data received during a current cycle, and (ii) forgoing compression of soft data received during a current cycle.

15. A data storage system, comprising:
at an encoder of a storage medium of the data storage system:
  means for receiving, at a plurality of latches respectively associated with a plurality of memory cells of the storage medium, soft data corresponding to data subject to a read operation specified by a storage controller of the data storage system;
  means for compressing the soft data;
  means for storing the compressed soft data in a buffer before transmitting the compressed soft data to the storage controller;
  means for writing, upon the buffer being full, uncompressed soft data back to at least a subset of the plurality of latches; and
  means for resuming, upon completion of the writing of the uncompressed soft data, compressing and storing of soft data in the buffer, and transmitting the compressed soft data to the storage controller.

16. The data storage system of claim 15, wherein the subset of the plurality of latches includes at least one latch from which the soft data was received.

17. The data storage system of claim 15, further comprising:
means for associating a plurality of address pointers to the plurality of latches; and
means for writing the uncompressed soft data back to the subset of the plurality of latches in accordance with the plurality of address pointers.

18. The data storage system of claim 15, further comprising means for disabling error correction at the encoder while writing the uncompressed soft data back to the subset of the plurality of latches.

19. The data storage system of claim 15, wherein:
the soft data includes a plurality of bytes; and
the means for compressing the soft data include:
  means for indicating a position of a first logic 1 within a first subset of the plurality of bytes; and
  means for indicating a position of a second logic 1 within a second subset of the plurality of bytes;
  wherein the first and second subsets of the plurality of bytes overlap, the first subset of the plurality of bytes includes a byte not included in the second subset of the plurality of bytes, and the second subset of the plurality of bytes includes a byte not included in the first subset of the plurality of bytes.

20. The data storage system of claim 15, wherein:
electrical interface circuitry of the data storage system includes a data path having a first width; and
the encoder includes two compressors, each compressor including means for compressing data in groups of bits associated with a second width different from the first width;
the encoder further includes a plurality of flip flops; and
the means for compressing the soft data further include:
  means for, at a first of the two compressors, alternately: (i) compressing soft data received during a current cycle and soft data received during a previous cycle stored in the plurality of flip flops, and (ii) compressing only soft data received during a current cycle; and
  means for, at a second of the two compressors, alternately: (i) compressing soft data received during a current cycle, and (ii) forgoing compression of soft data received during a current cycle.

* * * * *